United States Patent [19]

Stengl et al.

[11] Patent Number: 4,985,634
[45] Date of Patent: Jan. 15, 1991

[54] ION BEAM LITHOGRAPHY

[75] Inventors: Gerhard Stengl, Wernberg, Austria; Hilton F. Glavish, Salem, Mass.

[73] Assignee: Oesterreichische Investitionskredit Aktiengesellschaft and Ionen Mikrofabrications, Vienna, Austria

[21] Appl. No.: 226,275

[22] Filed: Jul. 29, 1988

Related U.S. Application Data

[63] Continuation-in-part of Ser. No. 201,959, Jun. 2, 1988.

[51] Int. Cl.⁵ .............................................. H01J 37/30
[52] U.S. Cl. ............................... 250/492.2; 250/491.1; 250/398; 250/281; 250/248; 430/30
[58] Field of Search ............. 250/492.21, 492.2, 491.1, 250/398, 396 R, 396 ML, 281, 298; 430/30

[56] References Cited

U.S. PATENT DOCUMENTS

| | | | |
|---|---|---|---|
| 2,234,281 | 3/1941 | Ruska | 250/398 |
| 3,801,792 | 4/1974 | Lin | 250/398 |
| 4,563,587 | 1/1986 | Ward et al. | 250/492.21 |
| 4,823,011 | 4/1989 | Stengl et al. | 250/492.21 |
| 4,859,857 | 8/1989 | Stengl et al. | 250/398 |

OTHER PUBLICATIONS

Lischke et al., "A Study on the Operation Condition for (1:4) Electron Projection Systems," Eighth International Conference on Electron and Ion Beam Science and Technology, Seattle, 1978.
Lischke et al., "Investigations about High Performance Electron-Microprojection Systems," Eighth International Conference on Electron and Ion Beam Science and Technology, Seattle, 1978.
Asai et al., J. Vac. Sci. Technol., 16 (6), Nov./Dec. 1979, pp. 1710–1713.

Primary Examiner—Jack I. Berman
Attorney, Agent, or Firm—Fish & Richardson

[57] ABSTRACT

Apparatus and method for projection ion beam lithography are described which allow formation of low distortion, large field, reduced images of a mask pattern at a wafer plane using an optical column of practical size. The column shown is comprised of an accelerating Einzel lens followed by a gap lens, with numerous cooperating features. By coordinated selection of the parameters of the optical column, lens distortion and chromatic blurring are simultaneously minimized. Real time measurement of the position of the image field with respect to the existing pattern on the wafer is employed before and during the time of exposure of the new field and means are provided to match the new field to the existing pattern even when the latter has been distorted by processing. A metrology system enables convenient calibration and adjustment of the apparatus.

51 Claims, 14 Drawing Sheets

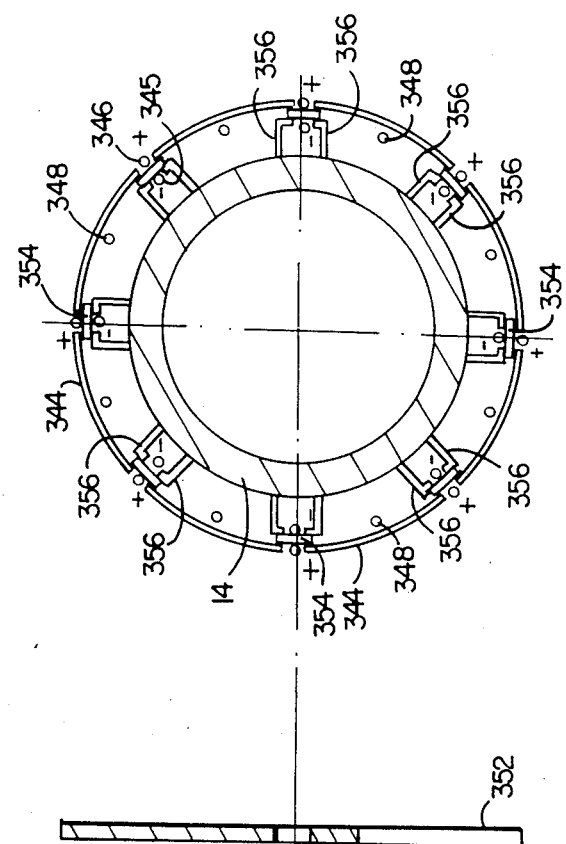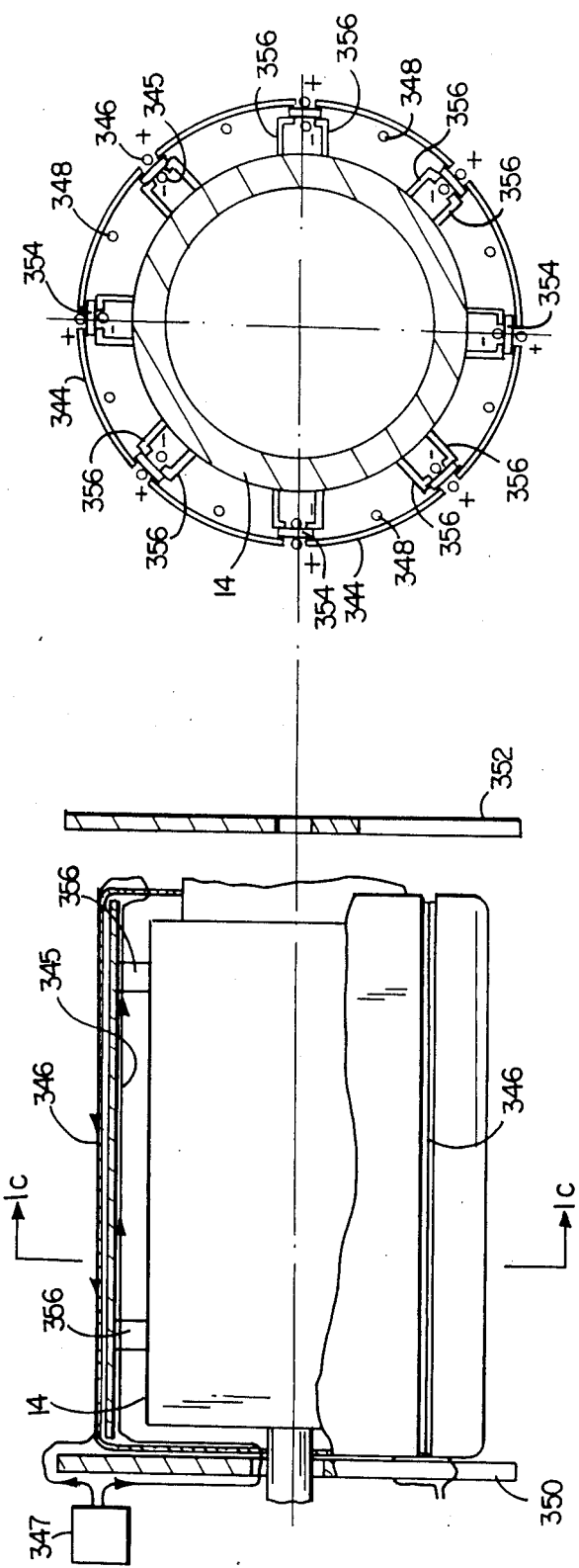

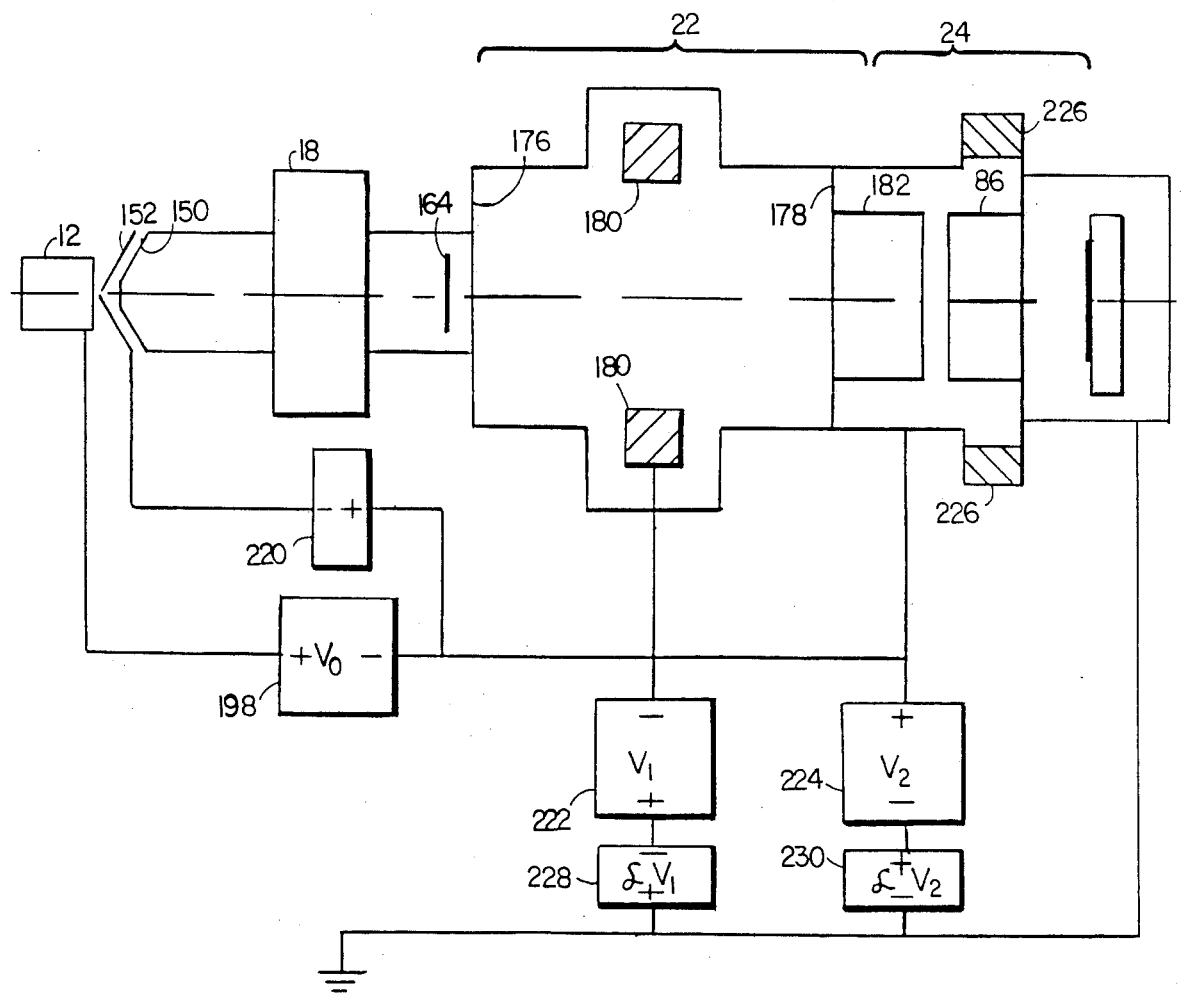
FIG. 2c
FIG. 3
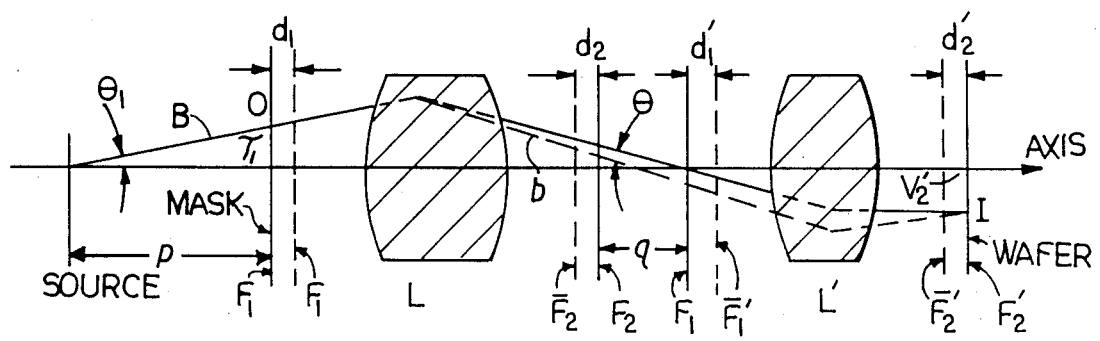

ION BEAM LITHOGRAPHY

INTRODUCTION

This application is a continuation in part of U.S. patent application Ser. No. 201,959 filed June 2, 1988, entitled "Method and Apparatus for Image Alignment in Ion Lithography" which is hereby incorporated by reference.

This invention relates to ion beam projection lithography for manufacturing of semiconductor devices and the like.

Of the various processes required to manufacture semiconductor devices, lithography is a highly important step. Simply described, the lithography process begins by coating a silicon wafer with a thin photosensitive material called photo-resist, or simply "resist". A lithographic exposure tool projects an image of a pattern contained on a mask or reticle onto the resist-coated wafer. The wafer is stepped through a series of exposure positions by which the same Pattern of the mask is exposed a number of times on the wafer. Development leaves a resist pattern that delineates the desired images on the wafer surface. The wafer is then subjected to any one of many possible processes such as etching, oxidation, ion implanting, diffusion, and deposition. After processing the wafer is inspected, recoated with resist and the cycle is repeated from 8 to 15 times resulting in a checker-board array of identical microcircuits on the wafer.

Most projection lithography to date has employed a beam of light for exposure of the wafer, but the demand for smaller feature size and higher density of components has led to a search for higher degrees of precision. A great effort has been spent on seeking to provide X-ray lithographic systems, while other systems, including ion beam projection lithography have received some, but considerably less attention.

One principal aim of the invention is to overcome what has appeared to be limitations and drawbacks of prior proposals for ion beam projection lithography. Another aim is to provide to industry an overall practical ion lithographic system suitable for commercial use and especially capable of forming very small features in overlayed patterns on a wafer.

SUMMARY OF THE INVENTION

According to one aspect of the invention, an ion projection lithography apparatus is provided comprising the means to provide an ion beam, a mask in the path of the ion beam with apertures for producing a desired beam pattern, an optical column after the mask, the column defined by first and second principal lenses located along the ion path, the first lens being an accelerating Einzel lens (i.e. an Einzel lens configured to first accelerate, then decelerate the ions) arranged to form a crossover within the column, the second lens positioned after the crossover and being a gap lens, arranged to project a reduced image of the mask, and a target station after the gap lens for supporting a target that receives the image.

Preferred embodiments of this aspect of the invention have the following features. The mask is located substantially at the first focal plane of the first lens and the target station is located substantially at the second focal plane of the second lens. The means to provide the ion beam comprises an ion source and means to provide to the lens column a virtual image of the ion source more distant from the column than the ion source and the distances (1) between the second focal plane of the first lens and the first focal plane of the second lens, and (2) between the mask and a point defining the virtual image of the source, being selected to produce the image of the mask at the target with chromatic blurring and geometrical distortion, arising from the lenses, simultaneously substantially minimized. The lenses are positioned to locate the crossover of the first lens substantially at the first focal plane of the second lens to produce a substantially telecentric beam following the second lens.

In a particularly preferred embodiment of the invention, the lens system simultaneously satisfies substantially the following conditions whereby the beam emerging from the second lens is substantially telecentric and at the image plane is substantially free of chromatic blurring and geometrical distortion:

$$qp = f_1 f_2 \tag{1}$$

$$\frac{(\delta_1/f_1)}{(\delta_1'/f_1')} \approx \frac{p}{p+f} \tag{2}$$

$$\frac{G(p)}{(D'/f_1')} \approx \left(\frac{p}{f_2}\right)^3 \tag{3}$$

where q is the distance between the second focal plane of the first lens and the first focal plane of the second lens; p is the distance between the mask and a point defining the virtual image of the source; $f_1$ is the first focal length of the first lens; $f_1'$ is the first focal length of the second lens; $f_2$ is the second focal length of the first lens; $\delta_1$ and $\delta_2'$ are the changes in the first focal length of the first and the second lenses, respectively, due to a change in the energy of the ions in the beam; and $G(p) = ap^3 + bp^2 + cp + d$. The constants a, b, c and d are lens constants related to the transfer function from the first focal plane to the second focal plane of the first lens, in the presence of third order distortions, the transfer function being of the form:

$$\theta_2 = -\frac{r_1}{f_2} + ar_1^3 + br_1^2\theta_1 + cr_1\theta_1^2 + d\theta_1^3.$$

where $r_1$, $\delta_1$ are the transverse radial and angular coordinates of a given ion path at the mask and $\delta_2$ is the transverse angular coordinate of the ion path at the second focal plane of the first lens. The coefficient D' is a coefficient in the transformation from the first focal plane to the second focal plane of the second lens:

$$r_2' \approx f_1 \delta_2 + D' \delta_2^3$$

where $r_2'$ is the radial coordinate of the ray at the second focal plane of the second lens (i.e., the target position).

In preferred embodiments of the invention, the ions in the ion beam at the target are preferably at energy between about 50 and 200 kV. The ions in the ion beam at the mask are preferably at energy between about 1 and 10 kV. The image of the mask at the target is preferably reduced by at least a factor of 1.5 or more, the image at the target being no less than 10 mm in height and width.

Preferred embodiments of the invention also have the following features. A pair of field control apertures is provided, one disposed on each side of the second electrode of the Einzel lens to reduce the electric field strength arising from the second electrode in the area about the mask and the area about the aperture of the third electrode of the Einzel lens. Means are provided to apply a voltage ratio in the range of 7-20 or more between the electrodes of each of the first and second lenses. The means to provide the ion beam comprises an ion source and a lens located between the ion source and the mask for selecting the virtual source point along the axis of the optical column to fine-tune the system for simultaneously minimizing chromatic blurring and geometric aberration arising from the lenses. This lens is preferably a solenoid adapted to contribute to the selection of the desired ion specie from various species of different mass issued from the source by differential deflection of the species according to their mass, preferably an aperture being located between the first and second lenses to prevent passage of ions differing in mass from the desired specie.

According to another aspect of the invention, a multipole means is located within the second lens or beyond it for application of quadrupole fields to vary the magnification of the image at the target in the X direction relative to the magnification of the image in the Y direction, preferably the multipole means being located after the second lens in a region substantially free of electrical fields.

According to another aspect, a multipole means is located between the first and second lenses adapted to apply dipole fields for adjustable movement of the image in the plane perpendicular to the axis of the optical column, preferably the multipole means being further adapted to produce superposed higher order fields for fine control of distortion and blurring in the image. Preferably the multipole means is a pair of successive 16 pole curved arc arrays adapted to introduce a parallel offset to the beam. Also in preferred embodiments of the invention, a voltage adjustment device is provided for variation of the lens voltages for fine-tuning the balance of distortion and blurring in the image. Preferably the voltage adjustment device is further capable of disproportionate adjustment of the lens voltages for tuning the magnification of the image at the target.

Preferred embodiments of the first stated aspect of the invention also have the following features. The voltage on the first electrode of the gap lens is substantially the same as the voltage on the first and third electrodes of the Einzel lens and the voltage on the second electrode of the gap lens is substantially the same as the voltage on the second electrode of the Einzel lens such that ripple effects on the power supply do not substantially alter the voltage ratio of the lens column, thus substantially preserving the quality of the image at the target station.

The apparatus is constructed to enable the diameter of the gap lens to be changed to vary the magnification of the image at the target, the beam emerging from the second lens, upon the change, remaining substantially telecentric and substantially free of chromatic aberration and geometric distortion at the image plane. The lens column includes an external, rigid metal shell which extends substantially the full length of the lens column, with the shell being at constant potential and directly supporting the first and third electrode of the Einzel lens and the first electrode of the gap lens. The middle electrode of the Einzel lens is supported by insulators engaged for support upon the interior of the metal shell and the second electrode of the gap lens is supported via an insulator bushing supported by the downstream end of the rigid shell.

Preferably, a tubular shield of high permeability magnetic material extends about and is supported by the rigid metal shell. Preferably the tubular shield is comprised of a series of removable longitudinal segments and preferably end plates of high permeability magnetic material are mounted at each end of the tubular shield in a manner to provide magnetic continuity with the tubular shield.

In another aspect of the invention, an ion projection lithography apparatus comprises means to provide an ion beam, a mask in the path of the ion beam with apertures for producing a desired beam pattern, an optical column after the mask, the column defined by first and second principal lenses located along the ion path, the first lens being arranged to focus the ion beam, the second lens positioned after the first lens and being arranged to project a reduced image of the mask, a target station after the second lens for supporting a target that receives the image, and a shield of high permeability magnetic material extending about the optical column, the shield being comprised of a series of removable longitudinal segments that define a tubular shield and end plates of high permeability magnetic material in magnetic continuity with the tubular enclosure. Preferred embodiments of this aspect of the invention have the following features. Electrical conductors are provided inside the shield, arranged to provide adjustment to the magnetic field to which the ion beam is exposed, preferably the electrical conductors comprising an array of elongated loops within the shield. An array of longitudinally extending electrically conductive loops is associated with the shield, the loops being arranged to establish magnetic flux in the circumferential direction in the tubular shield, preferably there being provided means to apply an alternating electrical current to the loops to demagnetize the shield and means to apply a momentary small bias current to the loops to increase the magnetic permeability of the shield, preferably each of the conductive loops comprising longitudinally extending conductive segments extending along the interior and the exterior of the tubular shield and electrical conductors are provided inside the shield, arranged to provide adjustment to the magnetic field to which the ion beam is exposed.

In another aspect of the invention an ion projection lithography apparatus comprises means to provide an ion beam, a mask in the path of the ion beam with apertures for producing a desired beam pattern, an optical column after the mask, defined by first and second principal lenses located along the ion path with the first lens being arranged to focus the ion beam and the second lens positioned after the first lens and arranged to project a reduced image of the mask and a target station after the second lens for supporting a target that receives the image. The means to provide the ion beam comprises an ion source and a solenoid lens located between the ion source and the mask for selecting the virtual source point along the axis of the optical column, with the solenoid adapted to contribute to the selection of the desired ion specie from various species of different mass issued from the source by differential deflection of the species according to their mass. Preferably, the solenoid is a counterwound double solenoid adapted to prevent rotation of the ion beam during passage through the solenoid and preferably an aperture is located between the first and second lenses sized to prevent passage of ions differing in mass from the desired specie.

In yet another aspect of the present invention, an ion projection lithography apparatus comprises means to provide an ion beam, a mask in the path of the ion beam with apertures for producing a desired beam pattern, an optical column after the mask, defined by first and second principal lenses located along the ion path, with the first lens arranged to focus the ion beam, and the second lens positioned after the first lens and being arranged to project a reduced image of the mask, and a target station after the gap lens for supporting a target that receives the image. A multipole means is located within the second lens or beyond and a voltage control system is adapted to apply quadrupole fields to the multipole means to vary the magnification of the image at the target in the X direction relative to the magnification of the image in the Y direction. Preferably, the multipole means is located after the second lens in a region substantially free of electrical fields and preferably, is a sixteen pole circular array of arc-form electrodes.

Another aspect of the invention is a lithographic method, for producing features of size of the order of 0.1 micron on a target, comprises the steps of providing an ion beam projection lithographic system capable of imaging the desired features of a lithographic mask upon a target field, the system having a set of adjustable parameters, and using a metrology mask having an array of metrology features, empirically determining the effect of each of the parameters across the target field while the other parameters are held constant to provide a set of shim functions, initially setting the parameters of the system by linear optimization based upon metrology measurements across the field, exposing targets through a lithographic mask having desired features, periodically interrupting the exposure, substituting for the lithographic mask a metrology mask defining an array of metrology features across the target field, measuring the blurring and geometrical distortion of the projected ion beam across the target field, determining from the measurement a set of error values, and by linear optimization, determining adjustments to the set of parameters to reduce the error values on the basis of the shim functions and resuming the exposure of targets.

Preferably the metrology mask defines an array of pairs of orthogonal slits for producing corresponding pairs of metrology ion beamlets that proceed to the target and the step of empirically determining the effect of each of the parameters across the target field while the other parameters are held constant comprises measuring the width and determining the centroid position of the beamlets at the target.

In yet another aspect of the invention, a lithographic apparatus comprising an ion beam projection lithography system having a set of adjustable parameters, the system adapted to project an image of a lithography mask upon a target mounted on an X, Y stage, the X, Y stage adapted to index across a number of exposure positions, a metrology mask adapted to be substituted for the lithography mask, a precision metrology stage mounted at a predetermined location on the X, Y stage, a detector mounted on the metrology stage adapted to be indexed across the ion beam field while the metrology mask is in position to determine error values based upon detected blurring and geometric distortion at points distributed across the field, the error values being useful to generate, by linear optimization techniques, correction to the set of parameters to reduce blurring and geometric distortion of the system. Preferably, the metrology mask defines an array of pairs of orthogonal slits for producing corresponding pairs of metrology ion beamlets that proceed to the target and the detector mounted on the precision metrology stage is adapted to measure the width and determine the centroid position of the beamlets at the detector and preferably the detector is associated with a pair of orthogonal slits arranged to intercept the metrology beamlets in the manner that only one beamlet of an orthogonal pair falls upon a corresponding slit at one time.

The apparatus and method for projection ion beam lithography just described allow formation of low distortion, large field, reduced images of a mask pattern at a wafer plane. The stated configuration of ion optical elements enables simultaneous reduction of the effects of energy spread of the ion beam (chromatic blurring) and balance of image aberration caused by lens distortion in an optical column of practical size. In this connection, it can be noted that the two lenses form a real image of a mask at a wafer in a manner that greatly reduces degradation of the image arising from the aberrations intrinsic in the lenses themselves. As is known, in forming a real image of the mask with a single, electrostatic lens, barrel or pincushion distortion is suffered, depending on whether the image of the mask is formed before a crossover or after a crossover—a crossover in this case being an image of the nearly point object generated by the ion source.

By providing the second lens following the first lens which in itself has the same type of defects, an image can be formed after the second lens in which distortion generated by the second lens corrects the distortion produced by the first lens. At a point, some distance down-stream from the second lens where an image that is substantially free of geometric distortion can be formed. Furthermore, a two lens combination can be selected so that at a specific point downstream of the second lens there is also a region less sensitive to the existence of energy spread in the ions, i.e. chromatic blurring. By coordinated selection of the parameters of the optical column, according to the invention, lens distortion and chromatic blurring are simultaneously minimized.

By use of the accelerating Einzel lens preceding the gap lens, the energy of the beam may be kept low while there can be sufficient ion energy at the ion source for its operation and the desired ion energy at the target can be at the level desired, there being no extreme voltages along the length of the column.

As mentioned above, in the preferred embodiment, the mask is positioned near the first focal plane of the first lens, which is an accelerating Einzel lens, and the wafer is positioned near the second focal plane of the second lens, which is a gap lens. The crossover of the beam resulting from the focusing of the first lens is located near the first focal plane of the second lens. Under these conditions, the ion paths from the mask image elements are substantially parallel to each other between the two lenses and the beam exiting the lens column and forming a real image of the mask at the wafer is substantially telecentric.

By positioning a solenoid directly after the ion source and before the mask as mentioned above, the solenoid is effective to both select the mass of ions impinging upon the wafer and to reduce the incident angle of the ion beam upon the mask, which therefore reduces the shadowing that can occur due to the mask thickness. The solenoid is also advantageously used to adjust the location of the virtual source point along the ion optical axis. This last function interplays with the balance of chromatic blurring from energy spread in the source and thereby permits fine tuning without the need for mechanical shifting of the ion optical elements. Furthermore, selection of the virtual source point enables minimization of the machine's overall length (the distance between the source and wafer) for large field imaging at the wafer plane, for the important purposes of saving capital costs and logistical convenience.

The present invention is especially useful in a method and apparatus to accurately overlay dies or patterns on a wafer. Marks, are placed, e.g., on the wafer adjacent to the corners of the die which is being exposed. Each of a set of microbeams, which proceed through the same optical system adjacent to but separate from the beam pattern that is to be imaged onto the wafer, is scanned by small scanning plates which do not affect the main field position, but do scan each microbeam over a limited range on the wafer surface. As each microbeam is separately scanned across a groove, a signal of secondary particles is created from the marks. This signal, sensitive to the relative position of the microbeam and the fiduciary map of marks on the wafer, is used to determine where the microbeam position is with respect to the mark. In conjunction with other microbeams spaced around the periphery of the chip, this provides a means for determining the position, magnification and orientation of the die field relative to the wafer. In this way it is possible, by processing the signals and applying corrective voltages to the field-imaging optics, to make an accurate overlay of one field on an existing pattern on the wafer.

This technique provides a real time measurement of the position of the image field with respect to the existing pattern, during the time of exposure of the new field. It also provides the means to match the new field to the existing pattern field on the wafer even when the latter has been distorted by processing.

DESCRIPTION OF PREFERRED EMBODIMENT
BRIEF DESCRIPTION OF THE FIGURES

FIG. 1b is a diagrammatic side view of the magnetic shield of the apparatus of FIG. 1;

FIG. 1c is a cross-sectional view taken on line 1c—1c in FIG. 1b.

FIG. 2c is a block diagram schematic of the power supplies employed with the embodiment in FIG. 1;

FIG. 3 is a schematic two lens optical arrangement illustrating an ion beam ray being perturbed by the presence of lens distortions and/or chromatic blurring.

FIG. 10b is an enlarged view of a component in the image pattern of FIG. 10a.

FIG. 11b is a cross sectional view along the line AA of FIG. 11a.

DETAILED DESCRIPTION

Figure 1:
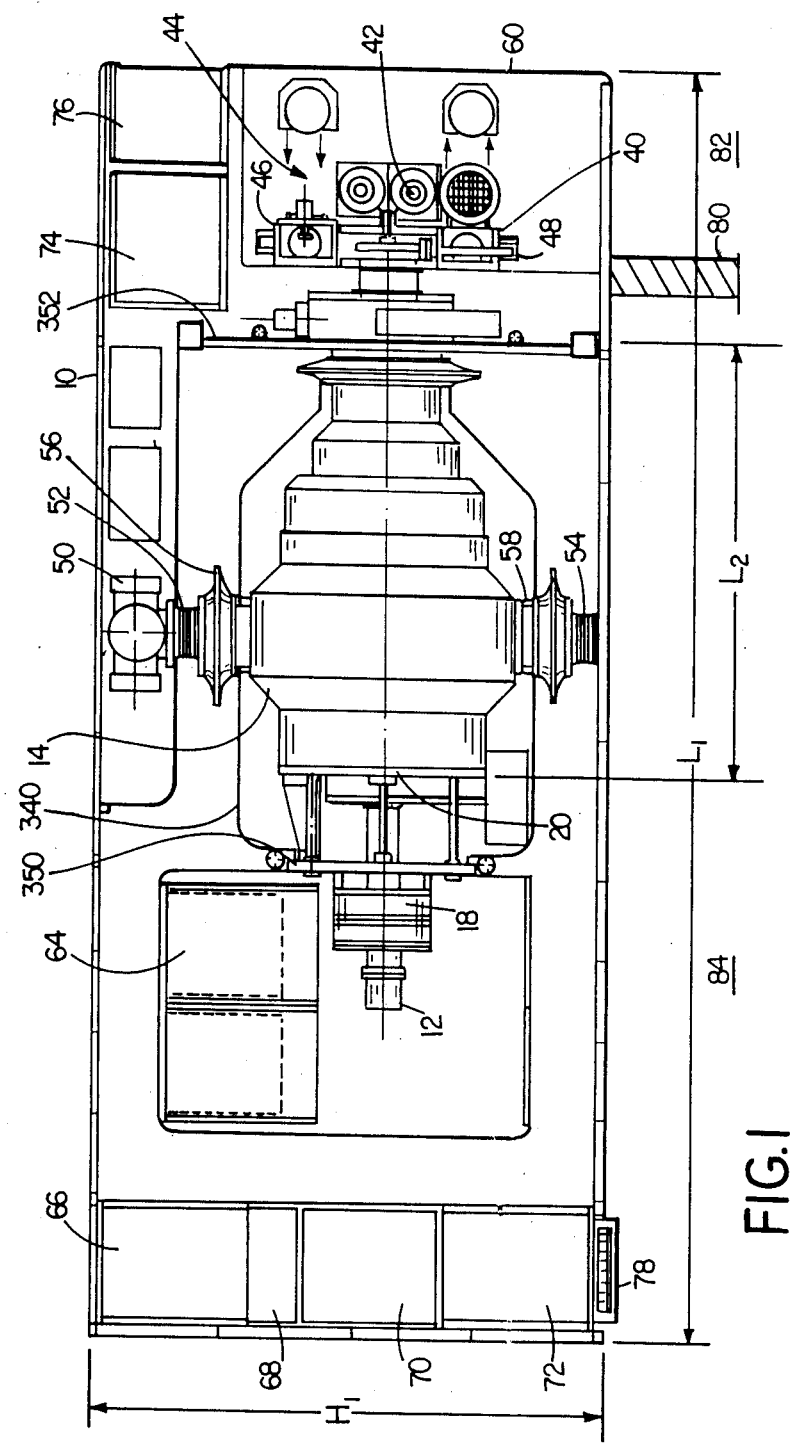
FIG. 1 is a plan view of the ion beam lithography apparatus of the preferred embodiment.
Figure 2:
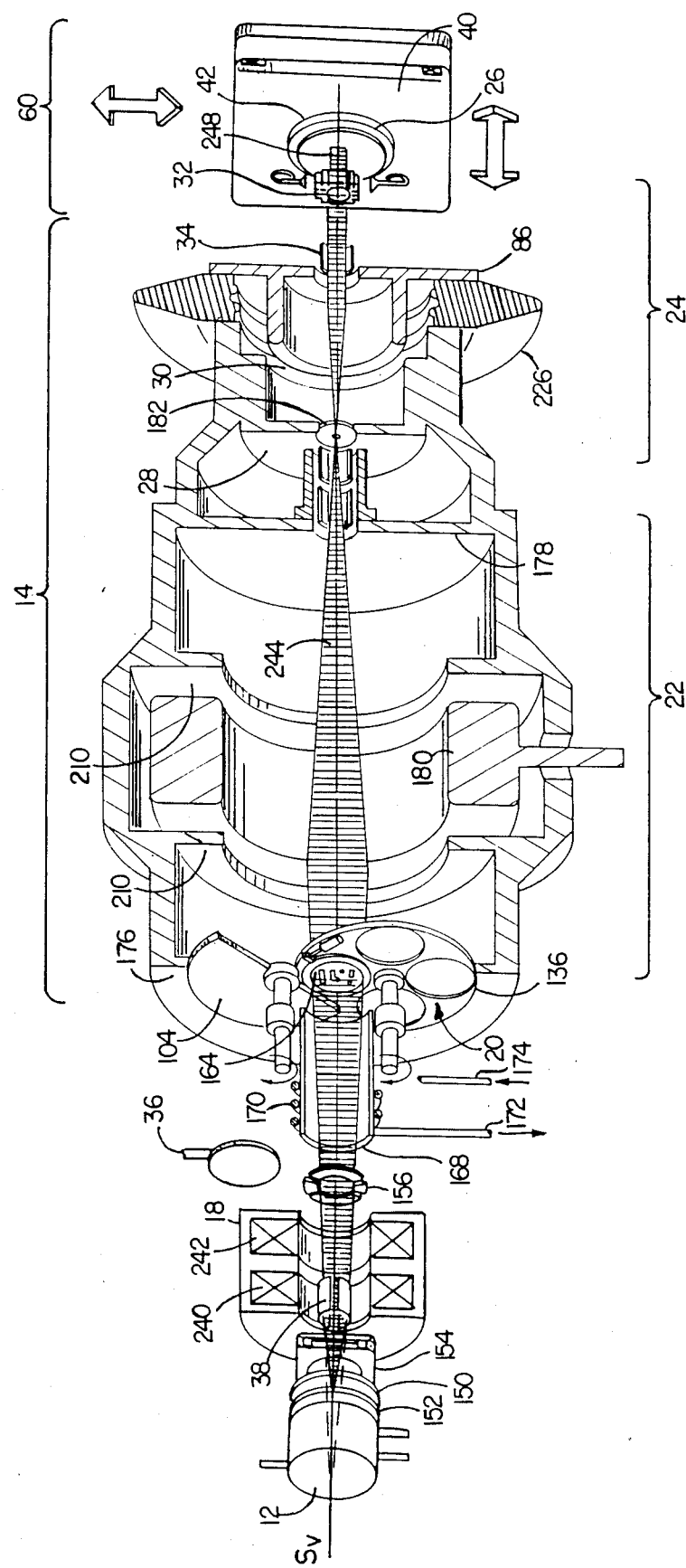
FIG. 2 is a three-dimensional cutaway view of the apparatus of FIG. 1 and 1a, indicating the ion beam trajectories and the inner components of the apparatus.

Referring to the plan view in FIG. 1 and the three dimensional cut away view in FIG. 2 of the preferred embodiment, an enclosure 10 surrounds the ion beam lithography machine to provide protection and support for its components. These are, in sequence, the ion source 12, solenoid 18, mask assembly 20, the optical column 14 and the end station 60. A magnetic shield 340 made of high permeability iron alloy surrounds the entire column 14 to substantially eliminate external stray static and time varying magnetic fields such as those generated by the earth's magnetic field, building materials and electrical power sources. The magnetic continuity of the iron shield at each end of the column is provided by iron plates 350, 352.

Referring to FIGS. 1b and 1c a cutaway side and cross sectional view of the shield, respectively are provided. The shield is constructed from a plurality of plates 344 which overlap and are supported by intermediate members 354 which in turn are supported by aluminum support members 356. An array of longitudinally extending wires 345 extend along the inside surface of the magnetic shield and then return 346 over the outer surface to form an array of discrete elongated loops. By control device 347 these wire loops are excited with alternating electric current which reduces in magnitude with time, to demagnetize the shield. Thereafter, device 347 applies a momentary small dc current to increase the magnetic permeability of the shield. Additional longitudinally extending current carrying wires 348 which form another set of discrete elongated loops on the inside of the shield are provided to enable reduction of any stray magnetic field in the region of the ion beam. The current through the wires 348 and in the loops defined by wires 345, 346 are independently variable to obtain the minimum magnetic effect on the ion beam in the column.

Referring back now to FIG. 1 and 2, ions are produced from the ion source 12, and pass through a double coil solenoid 18 that serves to analyze the beam 244, to separate the required ion specie, in this embodiment helium, from other ion beam species issued from the ion source. Following the ion source body 12 there is a suppressor electrode 152 and an extractor electrode 150. The suppressor plate electrode has a higher negative potential with respect to the ion source plasma than the extractor electrode and thus prevents downstream electrons from being accelerated onto and thereby causing unwanted heating of the ion source body 12. The potentials and shapes of the suppressor and extraction electrodes are chosen to form an ion beam with a small effective size (less than 20 $\mu$m diameter). The potential of the extractor electrode 150 defines the energy of the beam passing towards the mask, independently of the potential selected for the suppressor electrode 152.

Following the extractor plate 150, an ion source X, Y alignment stage 154 is provided which allows sliding movement of the entire source for proper alignment with respect to the axis of column 14. The two coils 240, 242 of the solenoid 18 are oppositely wound to provide counter directional magnetic excitation which acts upon the ions to prevent the beam from being rotated about its axis as a result of passage through the solenoid. The solenoid also reduces the angle at which the beam strikes the mask assembly 20; by thus reducing the solid angle of the ion beam, a greater flux may impinge upon the mask 164 and enter the column through its aperture. This reduction in angle is also important because the mask has a finite thickness (typically 1-5 $\mu$m) and the openings in it which define the pattern are typically very narrow. The reduction in the angle of incidence minimizes shadowing that occurs at the edges of the openings in the mask. Within the first winding 240 of the solenoid an electrical shutter 38 comprised of a multipole array is provided to deflect the beam from the column axis using dipole fields. This multipole may also apply quadrupole fields to adjust the magnification at the source beam in the X and Y directions (in the plane perpendicular to the beam axis) and thereby correct for elliptical distortions in the source.

Also provided in this region is vacuum isolation valve 36 which allows the optical column 14 to be sealed from the source during source replacement or repair and a dose monitor 156 which is positioned beyond the solenoid. The outer periphery of the beam impinges upon a known area of the monitor 156 and the induced current is measured. In this way the flux of the beam through the column may be deduced and the exposure time required for a given resist determined.

Figure 2A:
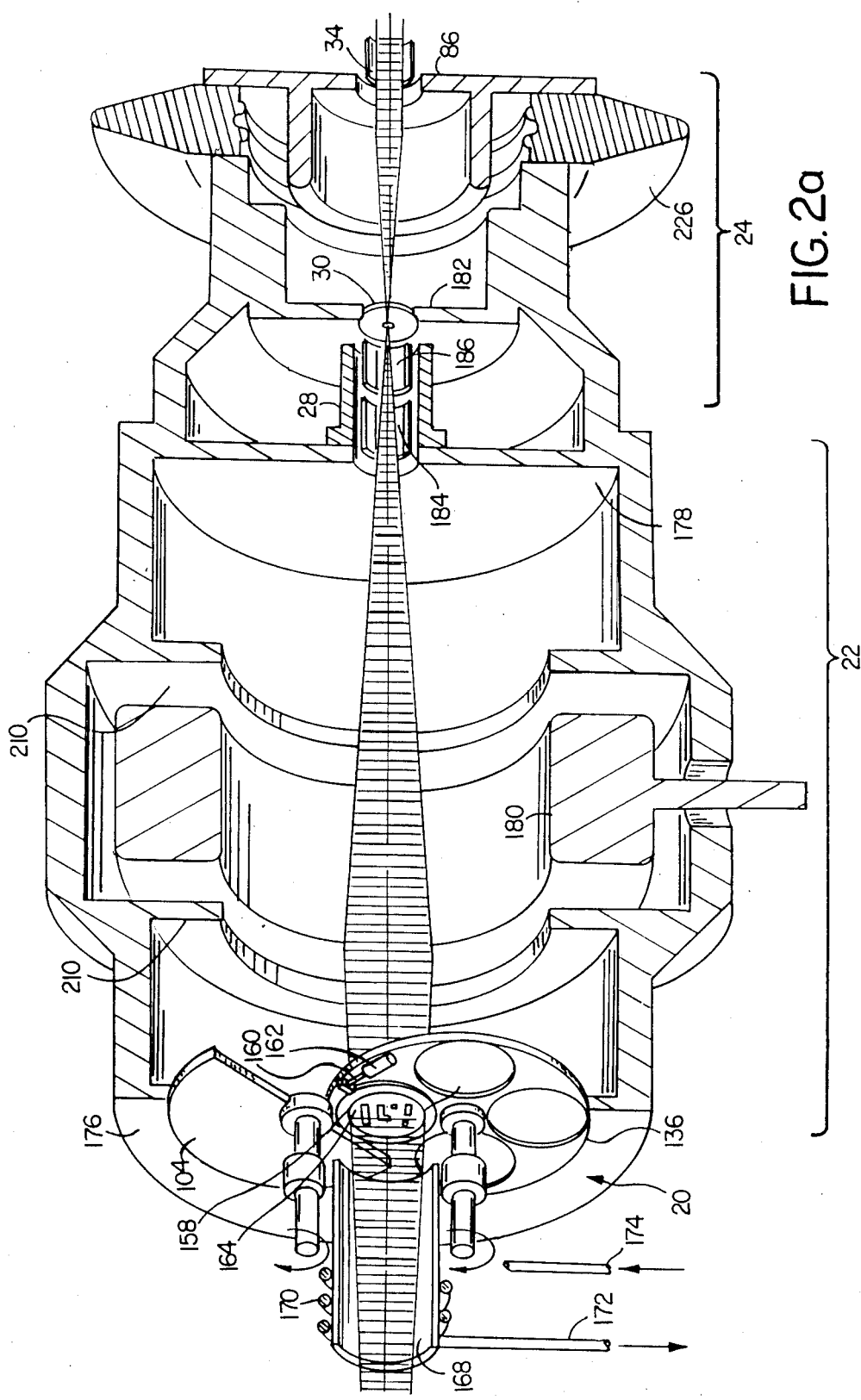
FIG. 2a is an enlarged view of the column region shown in FIG. 2.

Following the dose monitor 156, the beam continues on to the mask assembly 20 which is shown in FIG. 2 and most clearly illustrated in a blown up view in FIG. 2a. The mask assembly 20 includes a complementary set of masks 164, one of which is shown, on a rotating disk 136. By "complementary set" we refer to a set of different masks, each of which has openings that correspond to a respective part of a desired exposure pattern, such that successive exposure of the target through each of the mask exposes the target to the beam over the complete pattern. Each mask is mounted on a flexure mount 158 which permits rotation of the die pattern in response to linear motion of the pusher rod 160 driven by a piezo-electric transducer 162. In the preferred embodiment, rotation of the mask 164 and hence rotation of the die pattern on the order of ±500 microradians is controlled in response to a beam alignment system described below. Preceeding the mask assembly 20 is a mechanical exposure shutter 104 (shown in more detail in FIG. 5) and a mask cooling cylinder 168 which serves to remove the heat generated by that part of the beam which does not pass through the openings in the mask but instead is intercepted by the mask. The cylinder radiatively cools the mask 168 and extends about the beam axis. The cylinder itself is cooled by refrigerant introduced through inlet 174, circulated through concentric coils 170 and flowed out of the system through outlet 172. When the shutter 104 is positioned to block the beam from a mask, it simultaneously blocks the radiative cooling effects of the cylinder 168. The cooling system holds the mask at a near constant temperature thereby minimizing higher order geometric dimensional changes in the pattern on the mask.

Continuing to refer to FIGS. 2 and 2a, the beam, with its angle slightly modified by the solenoid passes through the mask 164 and enters a large diameter accelerating Einzel lens 22. The Einzel lens, as is known, is a three electrode lens. In this embodiment, the first electrode 176 and third electrode 178 are integrally formed from the column envelope, a rigid metal shell, and are at equal potential. The second, or middle electrode 180 is at a different, ion accelerating potential. A pair of field control apertures 210 are formed on either side of the second electrode 180 to truncate its electrical field.

As is well known to those skilled in the art, the electrical fields arising from the lens electrodes may be shaped by the physical contour of the lens. In an ideal lens system, without apertures, the electrical field lines will be symmetric and predictable. In real lens systems, apertures in the lens electrodes are required to allow for passage of the ion beam and these apertures perturb the ideal shape of the field lines. In the three electrode Einzel lens, the field lines produced by the central electrode may Pervade the apertures of the first and third electrodes. On the first electrode 176 side the field lines of the central electrode may also pervade the mask apertures at which point they take on a complex shape and exert forces on the ion beam and mask which result in perturbation errors at the image. On the side of the third electrode 178, the field lines are affected by the electrode aperture also generating unwanted perturbation errors at the image. The field control apertures 210 on either side of the second electrode 180 of the Einzel lens reduce the perturbations produced by the lens apertures. Shaping the field lines in this way therefore allows higher voltages to be applied to the electrodes.

The beam trajectory is changed by the Einzel lens so that it converges and forms a crossover or an image of the ion source between the Einzel lens 22 and a second, gap lens 24 which in turn is used to accelerate the ions and form an image of the mask on the target 26. As is well known, a gap lens is a two electrode lens having first and second electrodes at a potential difference. In this case the first electrode 182 of gap lens 24 is an integral portion of the rigid shell and the second electrode 86 is supported by insulator bushing 226 at the end of the rigid shell. As suggested by the beam trajectory, which is shown schematically, the gap lens 24 forms beams of ions travelling substantially parallel to the axis of the column, with cross-section forming an image of the mask as it strikes the wafer. A system of this type is termed to be telecentric. The substantially telecentric nature of the beam is advantageous because it reduces errors in the magnification of the image caused by irregularities in positioning the wafer along the optical axis or imperfections in the wafer itself such as warped surfaces.

Figure 2D:
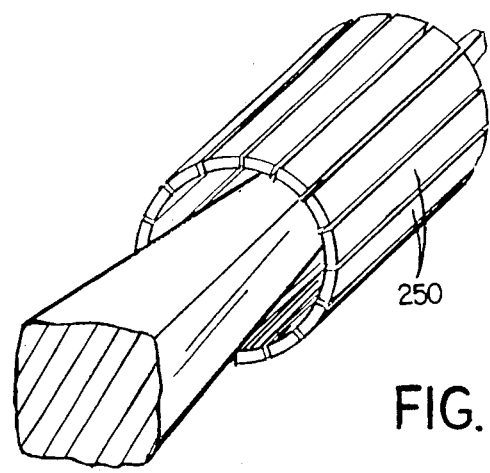
FIG. 2d is a diagrammatic, perspective view of a multipole array employed in FIG. 1.

Near the position where the Einzel lens 22 forms a crossover of the ion beam, there is multipole assembly 28, consisting of two successive multipoles 184, and 186 which, by application of suitable dipole fields alter the beam position in the X, Y plane (i.e., the target plane). By application of dipole fields equal in magnitude but opposite in sign to the two multipoles the beam may be offset from its original path, but remain parallel to it. The magnitude of these deflections is controlled by a beam alignment system to be described below and may be for example, $+/-$ 5 microns. The multipoles are preferably an array of 16 curved arcs 250 as shown in FIG. 2d which more closely approximate a cylindrical surface than conventional rods and may be used to generate any even powered fields (e.g. dipole, quadrupole, octupole etc.) up to a 16 pole field. In the practice of the preferred embodiment, the higher order fields are preset to correct for system distortions while the dipole fields for the deflection are superimposed.

As a practical feature in this preferred embodiment, locating the multipoles near the crossover allows the aperture of the multipole to be reduced since the beam diameter is converging toward its focus. Furthermore, the length to diameter ratio of a multipole should be approximately 5:1 and preferably 10:1 to avoid fringe field effects. With the diameter of multipole reduced because of its position near the crossover, the length can be reduced correspondingly such that it does not affect the overall system length in the design stage.

The multipole assembly 28 is closely followed by the mass selection aperture 30 which in conjunction with the solenoid serves to substantially select ions of only the desired mass for imaging onto the wafer. In a field free region, downstream from the aperture 30 and the gap lens 24, a multipole assembly 34 for generating quadrupole fields is provided for altering the relative magnification of the image in the X ($M_x$) and in the Y ($M_y$) direction in the wafer plane in opposition to each other. For example, if the magnification in the X-direction is made smaller, then the magnification in the Y-direction is larger. This element, therefore, is used to make fine adjustments to the magnification difference between X and Y to compensate for errors such as slight tilting of the wafer in the image plane about the X or Y axes. For absolute adjustment of the magnification the main lens voltages are used as described later herein. In the embodiment in FIG. 2, the quadrupole assembly 34 is an array of sixteen curved arcs as shown in FIG. 2d and is controlled by a beam alignment system to be described for making changes in the $M_x$ and $M_y$ by a factor of approximately $\pm 5 \times 10^{-4}$. Furthermore, the sixteen curved arcs make it possible to arbitrarily select and therefore change the orientation of the X and Y axes.

Furthermore, the location of the quadrupole assembly 34, away from the crossover is an important factor for minimizing the aberrations and distortions in the optical system. A quadrupole field at the crossover adds a first order term to a position where the balance of the two lenses comes into play. Therefore, the quadrupole is placed away from the crossover and preferably in a field free region. An alternative position for the quadrupole may be within the second electrode of the gap lens but still away from the crossover.

The accelerating Einzel/gap lens combination, FIG. 2, provides sufficient space between the gap lens 24 and the target 26 for location of a multipole of the required length. As previously mentioned in the discussion of the multipoles positioned between the lenses, a certain diameter to length ratio must be maintained for optimum performance. After the gap lens, the beam diameter is larger (approximately 15 mm) than at the crossover (approximately 1 mm) and therefore a correspondingly larger multipole array must be employed for application of the quadrupole field. It should be evident to those skilled in the art, however, that the differential control of $M_x$ and $M_y$ using a quadrupole field in an ion projection lithography lens system, would find utility in other lens combinations besides the embodiment shown in FIG. 2.

Just before the beam strikes the wafer, there is an alignment beam scanner and detector system 32 which is used to monitor the position, magnification and orientation of the image formed on the wafer and produce signals to induce correcting action of the optical elements to the extent an error is detected.

Figure 2B:
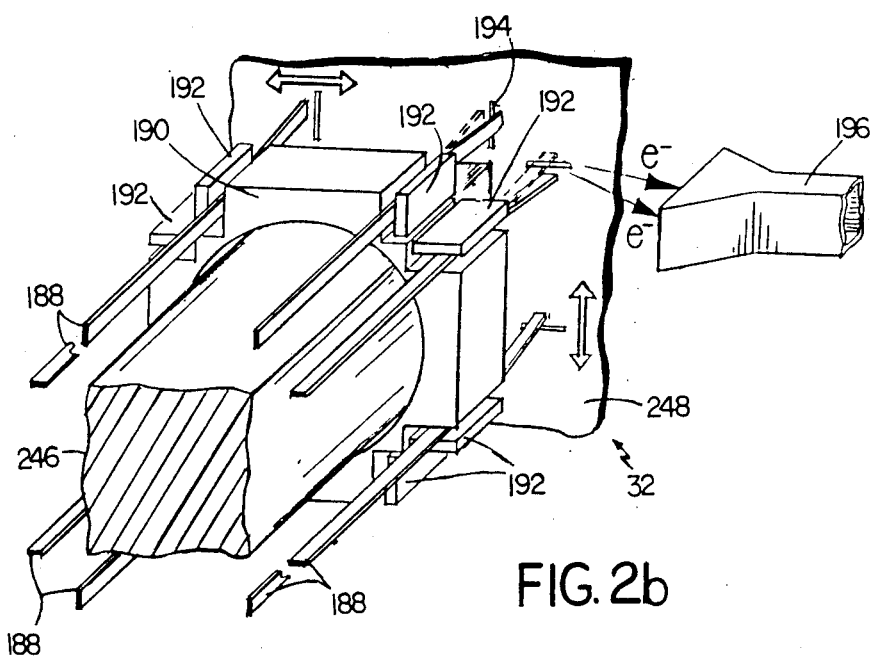
FIG. 2b is an enlarged diagrammatic view of the alignment beam scanner and detector system in FIG. 1.

In FIG. 2b this alignment beam scanner and detector system 32 is shown in more detail. Beamlets 188 are separated from the main die field 246 at the scanner system 32 by having the beamlets pass through the outside of an isolating member 190 while the die field 246 passes through its center as shown. The beamlets at this point are scanned separately from the die field by the application of dipole fields produced on the scanning plates 192. The beamlets are scanned across fiduciary marks 194 on a wafer 248. Backscattered electrons, arising from the beamlet impinging upon the marks, are detected by a detector 196 which may be a channeltron or an electron multiplier. Although only a single detector is illustrated, it should be understood that a detector is provided for each alignment mark. The signals from the detectors are used to locate the position and size of the die field 246 on the wafer 248. In response to the signals, correcting fields may be applied by the ion optical elements or the rotation of the field may be adjusted by rotation of the mask 164.

Figure 9:
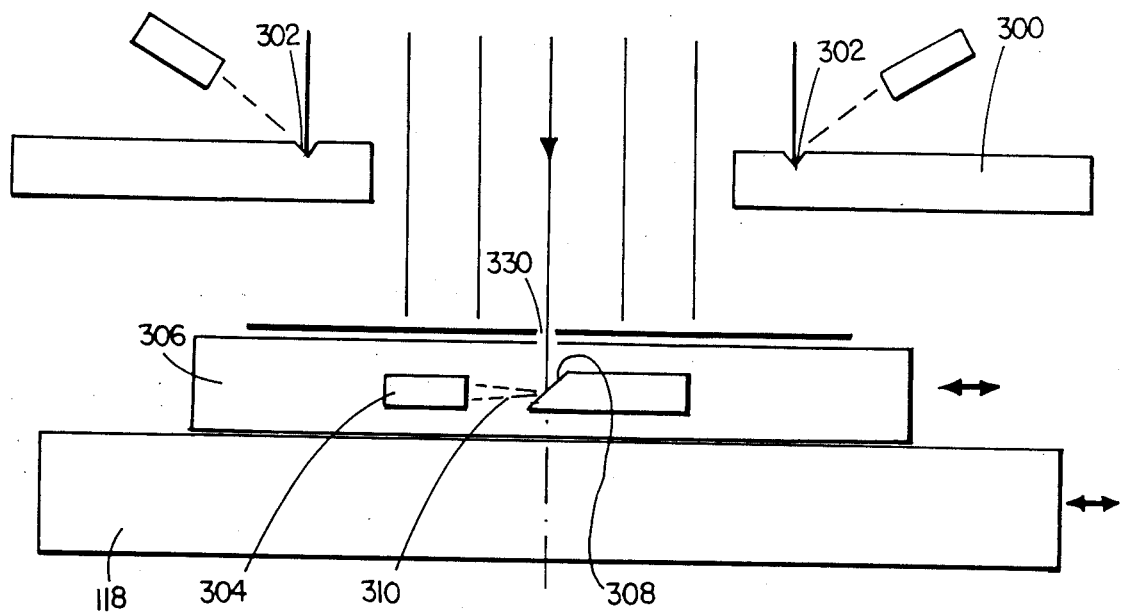
FIG. 9 is a schematic view of the target region of the invention with the system in the metrology mode.

Downstream from the beamlet scanners and detectors and just above the target an alignment ring 300 also with fiduciary marks 302 may be positioned (as shown schematically in FIG. 9; in the presently described embodiment, the mask is imaged on a wafer rather than the metrology stage 306 shown in FIG. 9). The location of the ring relative to the wafer may be detected interferometrically and the positioning of the die field in this embodiment could be responsive to the alignment marks on the ring only. In this case die patterns could be placed on a wafer without the use of wafer alignment marks and the wafer could be simply stepped from position to position to form repetitive patterns in a so called "blind stepping" mode. The alignment ring has further utility in measuring the image errors of the system with the system in a metrology mode as will be described later.

Referring back to FIGS. 1 and 2, the wafer 248 is mounted on a stage 40 which allows precision X, Y (in the wafer plane) and Z (along the optical axis) motion so that the wafer can be stepped from one position to another, and replicas of the image pattern can be formed at different positions on the wafer. Furthermore, the position of the wafer along the optical axis can be adjusted. The wafer is secured by a chuck 42. When a wafer has been completely covered with repetitive patterns, that is, the wafer has been stepped through the selected sequence of exposures of the beam, its chuck 42 can then be removed from the back of the stage and taken out of the vacuum system through vacuum locks 46 and 48. The chuck with a new unexposed wafer is inserted in the position that is appropriate on the stage.

As shown in to FIG. 1, various items of peripheral equipment are employed to operate the system. A suitable vacuum pump 50, illustrated as a turbo pump, evacuates the lens column. The pump is isolated from the lens both electrically and mechanically so that the lens assembly does not receive any vibration from external sources. A flexible bellows 52 is used to provide this isolation. The bellows has a vacuum on the inside and atmospheric pressure on the outside. The large sideways force that would exist on the lens is matched by an opposing bellows 54 on the other side of the machine. Since the lens column is at a high potential with respect to ground, an insulator bushing 56 for high voltage isolation is provided. An equivalent bushing 58 isolates the second bellows from ground on the other side of the machine. Other pumps on the lens and ion source assembly are treated in a similar manner, with the pumps located at ground potential At ground potential in locations that are convenient for maintenance are various other power supplies and auxillary functions for the machine as shown in FIG. 1. These include the lens power supplies 66, the power distribution panel 68 where the power is brought into the machine then distributed, a service module 70 which contains an isolation transformer to provide power to the components that are at high potential and controls for the vacuum system 72. The X, Y, Z stage electronic control systems are located near the stage in a cabinet 74. In console 76 there is a main touch screen control console containing the larger microprocessor or computer systems that are used to operate the machine. The functions of the control system can be transferred to an auxillary control system mounted at the rear of the machine 78 which can be used for maintenance. The machine may be bulk-head mounted, as indicated in FIG. 1, in such a way that the wafer handling part of the machine is in a clean room and the rest of the machine is in a via or maintenance room also maintained in clean conditions, but not as strictly clean as is required in an advanced semiconductor processing clean room. A wall is shown schematically as 80, the clean room 82, and the maintenance via, 84.

Figure 1A:
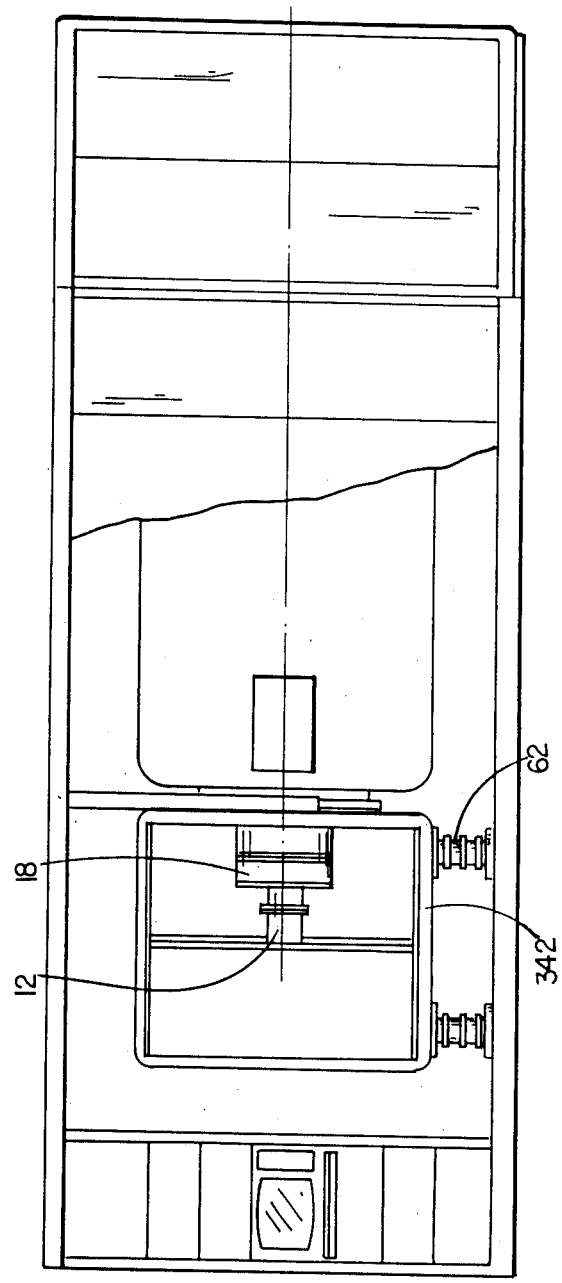
FIG. 1a is an elevation view of the apparatus of FIG. 1.

Around the ion source assembly is an enclosure 342 which is shown in an elevation view of this embodiment in FIG. 1a. The enclosure 342 is a cabinet in which pumps or power supplies or other controls can be placed and is isolated from ground potential by standing insulators 62. The ion source has a gas supply of the desired specie, e.g., hydrogen, helium or neon, that is in the enclosure of the ion source 64, shown in FIG. 1.

The overall length of the system, $L_1$ is 6.1 meters and the conjugate length (the distance from the mask to the target) is, $L_2$, 2.1 meters. The maximum height is, $H_1$, 2.5 meters. The ion beam expands from a point at the source 12 to approximately 10 mm at the first winding of the solenoid 240 and then to approximately 60 mm at the mask 164. The Einzel lens 22 focuses a beam of approximately 70 mm diameter to a crossover diameter of about 1 mm. After the crossover the beam at the gap lens 24 expands to between 15–24 mm (depending upon the size chosen for the gap lens) which diameter is substantially maintained on to the target 26 due to the telecentric nature of the beam.

In FIG. 2c a block diagram of the power supplies employed in the embodiment in FIG. 2 is shown. For positive ions, the source 12 is held at positive potential with respect to the extractor plate 150 by a first supply 198 at voltage $V_o$ which can vary the accelerating potential of extracted ions from, for example, 0–10 kV. A suppressor supply 220 holds the suppressor plate 152 at a negative potential with respect to the source for the purpose of repelling electrons.

A first system supply 222 applies a negative potential to the central electrode of the Einzel lens 180 with respect to first 176 and third 178 electrodes. In this configuration of electrode potentials, the Einzel lens is referred to as an accelerating Einzel lens, since the ions (positive ions in this embodiment) are accelerated between the first and second electrodes, then decelerated between the second and third electrodes. In this particular embodiment, the first and third electrodes being at the same potential, the net energy of the ions is not affected by this lens. The first 176 and third 178 electrode of the Einzel lens and the first electrode of the gap lens 182 are integral components of the rigid shell of the ion column 14 and receive a positive potential from a second power supply 224 as shown. (Other accelerating einzel lens configurations are practical in which there is a voltage difference between the first and third electrodes so that energy reduction of the ions between the middle and third electrode is not equal to the energy gain between the first and middle electrode. Such configurations may be implemented here with the addition of the proper insulators and power supplier without departing from many aspects of the present invention.)

The potential across the gap lens is provided by connecting the negative terminal of the second power supply 224 to the second electrode 86 of the gap lens which is isolated from the column by insulator 226. The gap lens therefore accelerates the positive ions prior to their exit from the column. The first power supply 222 may set the voltage $V_1$ relative to ground of this second electrode on the Einzel lens between for example, 0–10 kV. The second supply 224 is variable over a typical range, $V_2$, of 50–200 kV with a typical value being near 100 kV. The power supplies 222 and 224 in practice are used to provide a typical lens voltage ratio for both lenses in the range of 7:1 to 20:1 depending on the injection ion energy $V_o$ set by power supply 198.

Supplemental supplies 228 and 230 provide small voltage adjustments $\delta V_1$, and $\delta V_2$ to system supplies 222 and 224, respectively. The configuration illustrated in FIG. 3 provides a voltage ratio on the Einzel lens of $V_E$ where:

$$V_E = \frac{V_0 + (V_1 + \delta V_1) + (V_2 + \delta V_2)}{V_0}$$

and a voltage ratio on the gap lens of $V_G$, where:

$$V_G = \frac{V_0 + (V_2 + \delta V_2)}{V_0}$$

In practice, the value of $V_1$ is kept small so that the voltage ratios applied across the electrodes of the Einzel lens and the gap lens are approximately equal to avoid the detrimental effects due to inherent ripple on the power supplies. The energy of the ions impinging upon the target is then in the range of approximately 50-200 kV.

The focal length of the electrostatic lenses vary as a function of the potential difference between their electrodes and therefore the magnification of an image at some position beyond the lens may be varied. In the preferred embodiment of FIG. 2, a two lens configuration, the magnification of the image at the target 26 is equal to the ratio of the first focal length of the second lens over the second focal length of the first lens. By selecting the voltage ratios of the first and second lenses the gross magnification may be selected. Furthermore, if the voltage ratios applied to the lenses are increased proportionately, the focal lengths decrease nearly in proportion but the magnification does not change. This adjustment may, however, affect the distortion of the two lenses as will be discussed below. Therefore, variation of the lens voltages provides a fine tuning means for distortion and magnification. For this fine tuning, the supplemental supplies 228 and 230 are preferably under computer control for variation of the lens voltages by a few percent (e.g., 0-300 volts).

A practical advantage of the design, with the Einzel lens preceeding the gap lens, is that the outer envelope of the column is at a single electrical potential, and therefore there is no need for an insulator between the lenses. This provides a very rigid mechanical structure which assures a stable column alignment. Mechanical rigidity also lowers the vibrations between the mask 20 and the wafer chuck 42 and makes it possible to align the ion source and mass filter to the column in a rigid way and to prevent ions from being displaced away from the axis.

Figure 4:
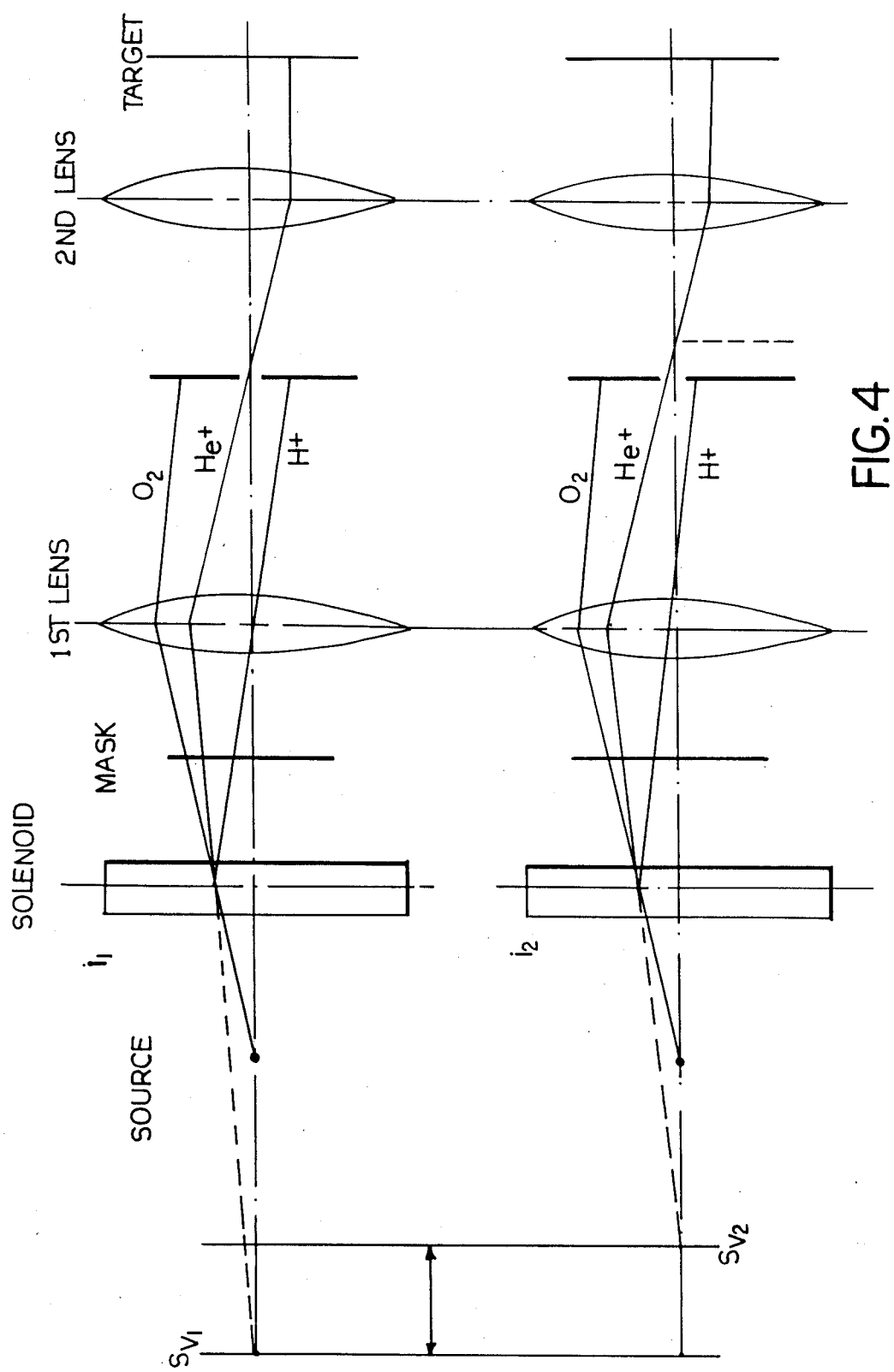
FIG. 4 shows schematic views depicting the operation of the solenoid for mass selection and positioning the virtual source point.

An important further feature of this invention is the use of the solenoid in an ion lithography system for both mass selection and the variation of the virtual source point along the optical axis as illustrated in FIG. 4. The beam from the ion source passes through the solenoid which bend ions towards its axis so that the lighter mass ions such as hydrogen take a greater angle toward the axis and the wanted ions such as helium will move approximately parallel to the axis. Ions heavier than the desired ions such as oxygen will not be bent significantly and will continue substantially in diverging straight lines originating from the source. The first mass selection may occur in the plane of the mask. Heavier ions will lie off of the optical axis and will strike the mask assembly. Heavier ion species that do pass through the mask will still appear to be diverging from the ion source, and will not be significantly focused by the first lens. Near the crossover, the mass selection aperture, then, allows only a small fraction of those heavier ions that reach that position to pass through and arrive at the target. Light ions will tend to be concentrated on the axis and therefore may pass through the mask to the optical column. However, because of their proximity to the axis of the first lens, these ions will not be focused and therefore, will also strike the mass selection aperture.

The solenoid is also used to adjust the location of the virtual source on the axis of the machine. Adjusting this position varies the location of the crossover and interplays with the balance of chromatic aberrations arising from energy spread in the source which will be discussed further below. In the top panel of FIG. 4, the position of the virtual source of helium ions is $SV_1$ for a first current level $i_1$ applied to the solenoid. Under these conditions, the path of the helium ions is focused by the first lens to form a crossover at the position of a mass selection aperture. In a lower panel of FIG. 4 a second current level $i_2$ is applied to the solenoid windings resulting in a slightly different ion path that produces a virtual source of helium ions at a $SV_2$. The helium ions in this case are focused to a crossover at a position slightly beyond the mass selection aperture. Since the condition for producing a telecentric beam after the second lens is to position the crossover near the first focal plane at the second lens, adjustment of the crossover position using the solenoid thereby allows the degree of telecentricity to be varied without the need to physically move the lenses along the optical axis. This is a significant advantage in terms of convenience and maintaining the optical alignment of the system.

As can be seen, at both positions of the virtual source in FIG. 4, the helium ions are selected for passage onto the target and both lighter and heavier ions are filtered. Therefore the solenoid may perform both functions simultaneously. It should be evident to those skilled in the art that the operation of the solenoid for mass selection and adjustment of the virtual source position would have utility in other electrostatic lens configurations which may include single lens systems or multilens systems of Einzel and gap lenses occurring in various sequences along the beam path. Furthermore, for use with the present lens column, the solenoid could be replaced by a simple electric lens if the mass selection function is performed differently. It should also be realized that the diameter of the aperture and its position along the optical axis may be selected for optimum mass filtering.

Referring back to FIG. 2, a double wound solenoid is employed in the preferred embodiment. The counter windings produce counter magnetic fields which prevent a net rotation of the beam. Furthermore, a focal length shorter by approximately 50% can be obtained over a single wound device since the beam experiences four sets of fringing fields as opposed to just two.

Figure 5:
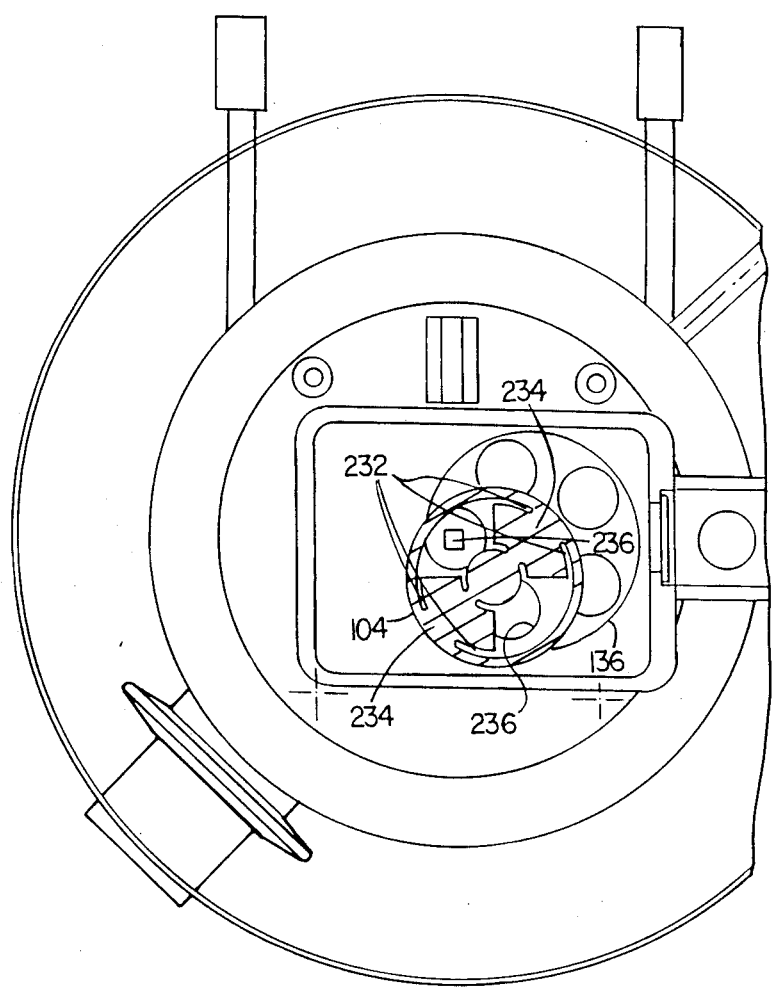
FIG. 5 is a view of the mask carousel and beam shutter from the embodiment in FIG. 1.

The carcusel 136 and shutter assembly 104 is shown in a view along the optical axis from the source in FIG. 5. The carousel in this embodiment holds four complementary masks that make up an entire pattern plus one metrology mask that is put in position in a metrology mode to measure machine distortion, as described below. The carousel rotates so that a mask comes into the axis of the column as shown in FIGS. 2 and in 5. When in position on the column a separate mechanism (not shown) clamps the mask to the back wall of the first lens. Opposite the position of the mask, is a vacuum lock chamber holding other masks and a mechanism that loads and unloads the masks from this carousel (not shown). Once a set of masks is unloaded then a vacuum valve is used to isolate that set from the main chamber and that set can be removed and replaced with another set. The carousel 136 is also compatible with the mask rotation assembly previously described which is capable of being rotated in a precise way to monitor the mask rotation as is required for the beam alignment system.

A rotating mechanical shutter 104 is used to control the exposure time. There are two shutter positions 234 which cover the mask and prevent exposure and two shutter positions 236 where the mask is fully exposed. Peripheral slots 232 in the shutter 104 are shown in FIG. 5. These allow the beam alignment function to occur without exposing the central die field of the mask. For example, just prior to exposure of the die field the shutter can be positioned such that three pairs of alignment marks in the mask are exposed to the beam through the slots. This is sufficient to determine five alignment parameters: X and Y translation in the wafer plane, rotation Φ and magnification, $M_x$ and $M_y$ with the resulting signals from the detectors 196 being used to control each one of the five parameters and the sixth beamlet being used to provide an error signal as a measure of the accuracy of the other beamlet signals. Once these parameters are established, exposure may begin. At some point during the exposure, during rotation of the shutter, one of the pairs is interchanged for another pair of alignment marks so that when the exposure is terminated the alignment has been retained right through exposure.

When the shutter covers the mask, it will also prevent the mask from being exposed to the cold surface of the mask cooling scheme so the mask will remain at the ambient temperature of the surround, and the beam will hit the shutter which will cool in just the same way as the mask. Therefore no extra cooling is needed for the mechanical shutter.

Imperfections in the image produced in ion projection lithography systems arise from the energy spread of ions, referred to as chromatic blurring, and the inherent distortions caused by the lenses themselves, referred to as lens distortions. Because the spherical aberration coefficient in electrostatic lenses is always positive, this lens distortion cannot be eliminated by lens combinations as is done in light optics where the coefficient may be of either sign. Distortions in electrostatic lenses may be balanced, however, by adding a second lens following the first which in itself has the same type of defect. An image can then be formed after the second lens in which the distortion generated by the second lens balances the distortion produced by the first lens.

Figure 6:
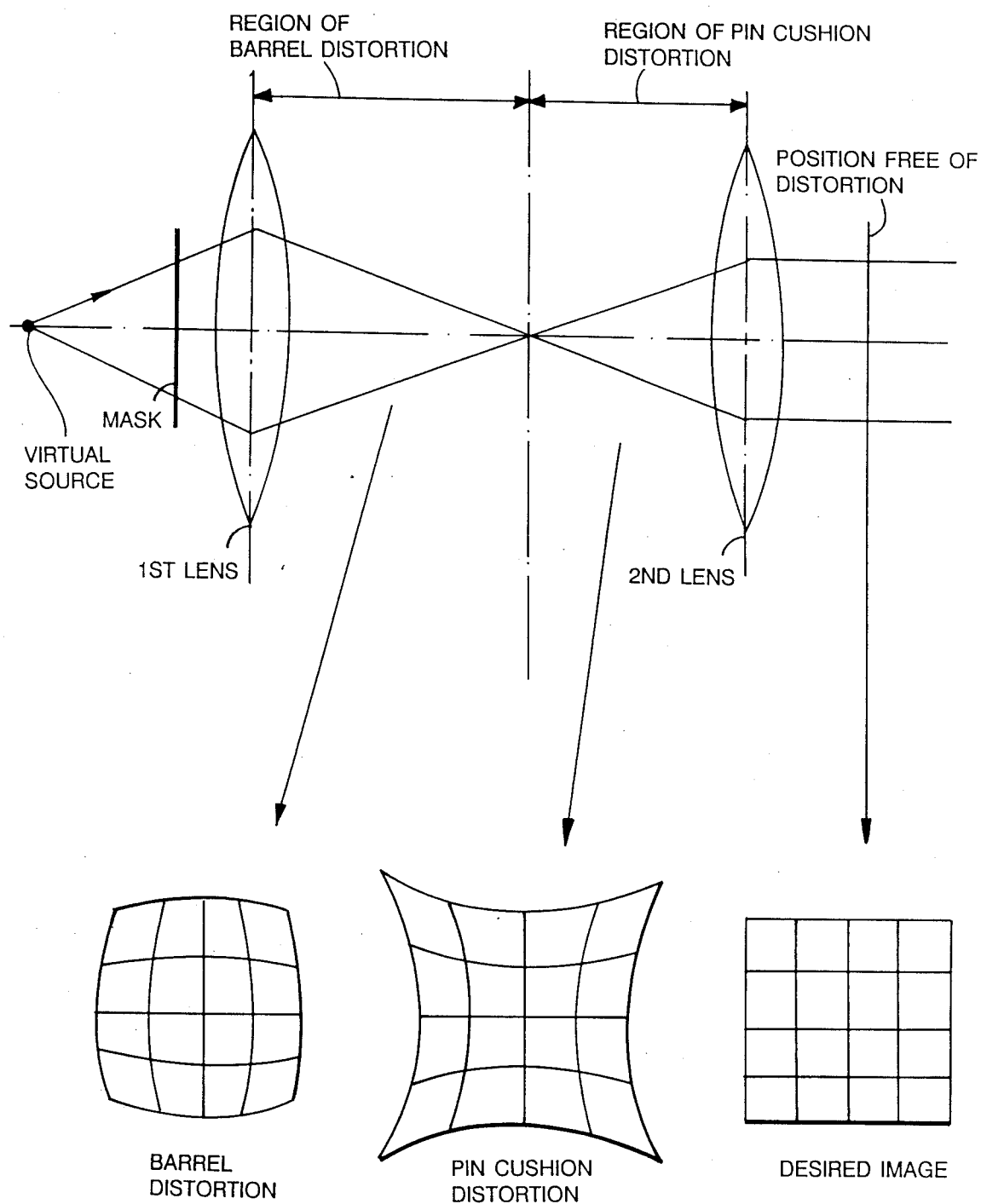
FIG. 6 is a diagrammatic illustration of the correction of barrel and pin-cushion distortions achieved with a two lens system.

As is known, in forming a real image of a mask with a single, electrostatic lens, barrel or pincushion distortion is suffered, depending on whether the image of the mask is formed before a crossover or after a crossover as shown in FIG. 6. If a second lens is added, barrel distortion it may introduce can be used to compensate for the pincushion distortion of the first lens. At some point downstream from the second lens, the barrel distortion of the first lens and pincushion distortion of the second lens are balanced and a distortion free image is formed. Further, the effect of chromatic blurring on the image in a two lens system is a function of various optical parameters which include the interlens distance and the source to mask distance. At the proper combination of these distances an image in which chromatic blurring are minimized occurs down stream from the second lens.

Figure 7:
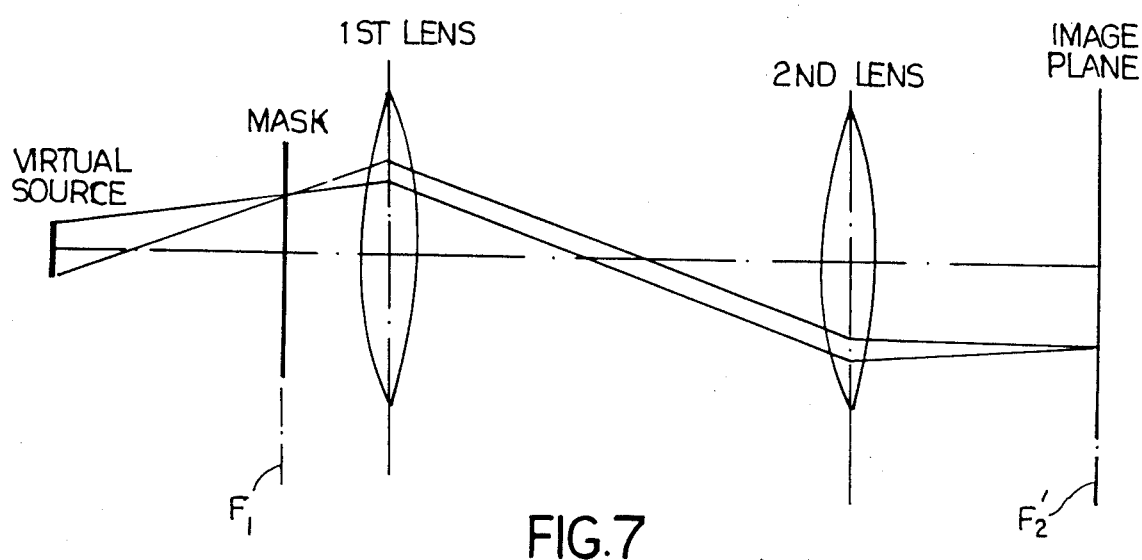
FIG. 7 is a diagram showing the formation of a parallel ion path in the region between the lenses and the creation of a telecentric beam after the second lens according to the invention.

The two lens configuration of this invention allows the effects of chromatic blurring and the intrinsic distortions of the lenses to be minimized at the same image position in a system of practical size. Furthermore, a real image of the mask with distortions and blurring minimized is formed in a telecentric beam at the target. The first lens is configured to form a virtual image of a mask element at infinity, i.e. the beam paths between the two lenses from a specific mask element are substantially parallel to each other. The second lens forms a real image of that virtual image at its exit focal plane. To achieve these aforesaid conditions, the mask is placed near the first focal plane of the first lens $F_1$ and the wafer is near the second focal plane of the second lens $F_2'$ as indicated in FIG. 7. Therefore, with the mask and the image near the respective focal planes, the distance between the two lenses can be selected in the design stage to minimize chromatic blurring without affecting the magnification of the image. Since the distance between the two lenses may be selected, an additional parameter besides source-to-mask distance is provided, enabling coincident minima to be found for chromatic aberration and geometric or lens distortion.

Figure 8:
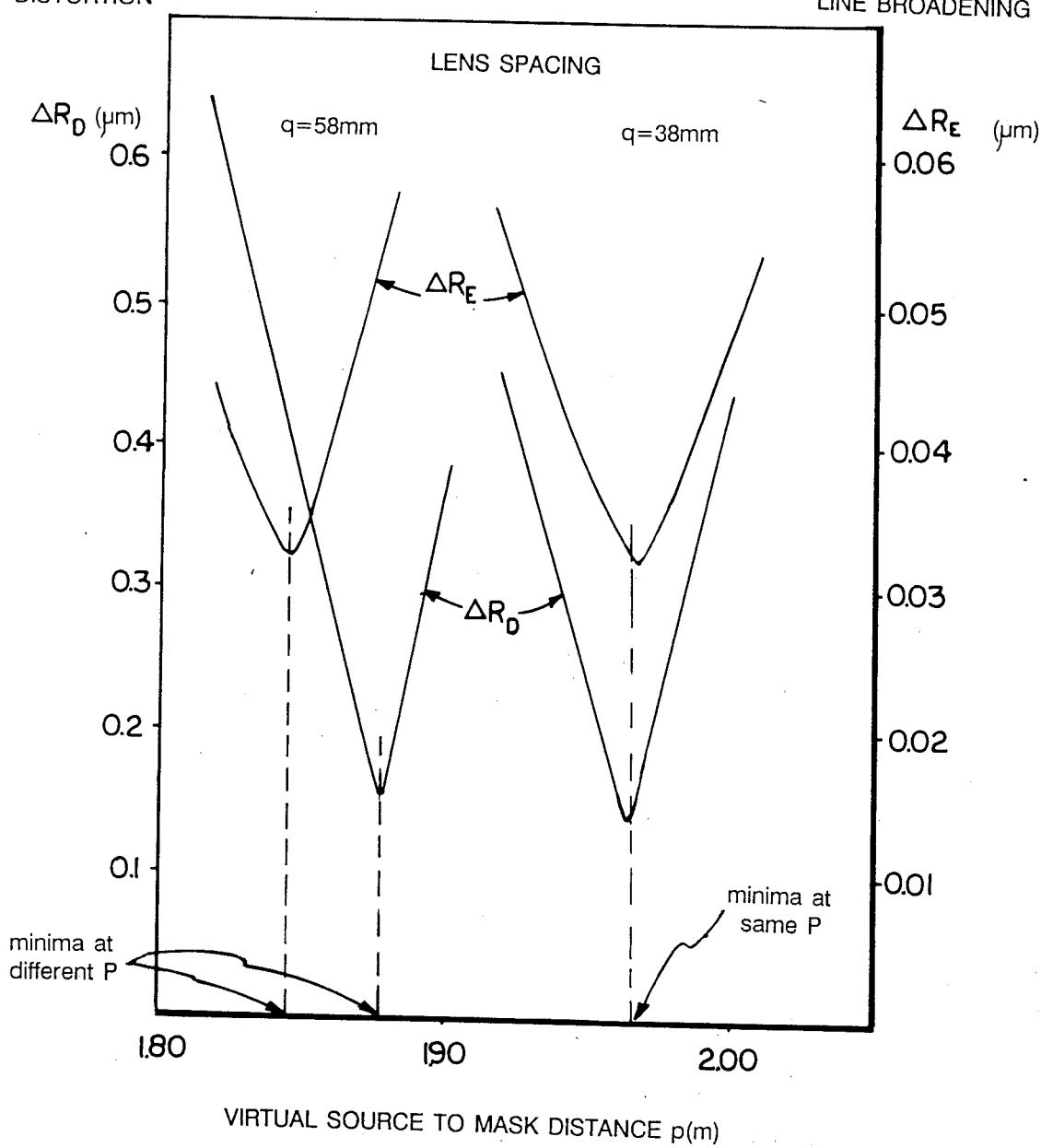
FIG. 8 is a graph illustrating lens distortion and line width broadening from chromatic blurring plotted as a function of the distance between the lenses for two source-to-mask distances.

For example, in FIG. 8, the lens distortion $\Delta R_o$ is plotted as a function the virtual source to mask distance p for two different spacings q between the two lenses. As the source distance is changed the distortion passes through a minimum. If the chromatic blurring $\Delta R_E$ of the image is also plotted it too is found to pass through a minimum at a particular source to mask distance for each lens spacing. Thus, there is a source distance for which a distortion minima occurs and in general, another source distance for which a chromatic blurring minimum occurs. For an appropriately selected lens spacing it is possible to have the distortion and chromatic blurring minima occur at the same virtual source to mask distance. Another feature of the optical system of this invention relates to generating different magnifications or reduction factors. The reduction factor is directly proportional to the focal length of the last lens, and the focal length of the last lens in turn is directly proportional to the lens diameter. By merely adjusting the diameter of the last lens, a corresponding change in the magnification may be obtained without affecting the balance of the distortions and aberrations which provides great flexibility. In the embodiment in FIG. 2, for example, it is only necessary to adjust the diameter of the final electrode 86 in the gap lens to cover a range of different factors, for example, from 2:1–10:1. As a practical feature in the case of an Einzel/gap lens combination, removal of the gap lens final electrode 86 is made easy since it resides at the end of the column as shown in FIG. 2. In another embodiment, the first electrode of the gap lens is made detachable from the lens column to allow the diameter of both electrodes to be charged.

LENS DISTORTION, CHROMATIC BLURRING AND TELECENTRICTY RELATIONSHIPS

For purposes of mathematical treatment, FIG. 3 shows an ion optical system featuring the two principal lenses L and L' with focal planes $F_1$, $F_2$ and $F_1'$, $F_2'$ respectively. The mask is located at the focal plane, $F_1$ and the wafer at the final image plane $F_2'$. A nominally point source is located at a distance in front of $F_1$ and is imaged by L at $F_1'$. This source may be virtual or real.

A distance p is defined between the source and the mask and a drift distance q between $F_2$ the second focal plane of the first lens and the first focal plane of the second lens $F_1'$. The solid ray B depicts the ideal first order path of a ray from ion source to image and the broken ray b depicts the path of a ray path perturbed by lens distortion and/or chromatic aberrations. In the case of such imperfections the focal planes are known to shift position and are represented in FIG. 3 by broken vertical lines $F_1$, and $F_2$ being the shifted first and second focal planes of the first lens, respectively, with the distances $d_1 = F_1 = \bar{F}_1$ and $d_2 = \bar{F}_2 - F_2$ and $F_1'$ and $F_2'$ being the first and second focal planes of the second lens, respectively with $d_1' = F_1' - \bar{F}_1' d_2 = \bar{F}_2' - F_2'$.

In first order optics the transverse coordinates of a particular ray (r, θ) transform linearly into new coordinates $(r'_1 \theta')$ at another position along the axis of the system. This is conveniently represented as a matrix, transform:

$$\begin{bmatrix} r' \\ \theta \end{bmatrix} = A \begin{bmatrix} r \\ \theta \end{bmatrix} = \begin{bmatrix} A_{11} & A_{12} \\ A_{21} & A_{22} \end{bmatrix} \begin{bmatrix} r \\ \theta \end{bmatrix} \quad (1)$$

where A is the transform matrix.

For focal plane to focal plane transfer through the lens L the transform matrix T has the form:

$$T = \begin{bmatrix} 0 & f_1 \\ -\frac{1}{f_2} & 0 \end{bmatrix} \quad (2)$$

where $f_1$ and $f_2$ are the first and second focal lengths of lens L, while for lens L' the transform matrix T' is $$T' = \begin{bmatrix} 0 & f_1' \\ -\frac{1}{f_2'} & 0 \end{bmatrix} \quad (3)$$

where $f_1'$ and $f_2'$ are the first and second focal lengths of lens L' and for the drift q from $F_2$ to $F_1'$ the transform matrix Q is:

$$Q = \begin{bmatrix} 1 & q \\ 0 & 1 \end{bmatrix} \quad (4)$$

The entire transform mask to wafer $\Gamma$ is thus:

$$\Gamma = T'QT = \begin{bmatrix} -\frac{f_1'}{f_2} & 0 \\ \frac{q}{f_2 f_2'} & -\frac{f_1}{f_2'} \end{bmatrix} \quad (5)$$

where eq. 5 follows from straight forward matrix multiplication. The specific transformation equations are thus:

$$r_2' = \left(\frac{f_1'}{f_2}\right) r_1$$

$$\theta_2' = \frac{1}{f_2 f_2'} \left[ q\left(\frac{r_1}{\theta_1}\right) - f_1 f_2 \theta_1 \right] \quad (6)$$

$$= \frac{1}{f_2 f_2'} (qp - f_1 f_2) \theta_1$$

where use has been made of the fact that $$r_1 = p\theta_1 \quad (7)$$

for a nominally point source.

Because the (1,2) element of the matrix $\Gamma$ is zero, the final position along the axis corresponds to a Gaussian image; i.e. $r_2'$ is independent of $\Gamma_1$.

Furthermore, from eq. (6) the magnification is $$M = -\left(\frac{f_1'}{f_2}\right) \quad (8)$$

representing a real inverted image because of the negative sign. Also from eq. (6), the telecentric condition $(\theta'_2 = 0)$ requires $$qp = f_1 f_2 \quad (9)$$

It should be noted that the image condition and the value of the magnification M are independent of q and p, whereas the telecentric condition defines a relation between these two distances.

The simple linear transformation described above is perturbed by both chromatic effects (energy spread in the ion beam) and lens distortions intrinsic in the lenses L and L'. If the perturbations on T and T' are $\Delta$ and $\Delta'$ respectively, the perturbed transform is $$\Gamma' = (T' + P) = (T' + \Delta')Q(T + \Delta) \quad (10)$$
$$= TQT + \Delta'Q\Delta + TQ\Delta + \Delta'QT$$

Retaining only first order perturbation terms leads to the following expression for the perturbation matrix P:

$$P = \Gamma' - \Gamma = TQ\Delta' \Delta'QT \quad (11)$$

The conditions for which the final beam transverse position $r_2'$ remains unperturbed will now be examined. According to eq. (11):

$$\Delta r_2' = P_{11} r_1 = P_{12} \theta_1 = (pP_{11} = P_{12})\theta_1 \quad (12)$$

Where $P_{11}$ is the (1,1) element of the matrix P and $P_{12}$ is the (1,2) element. Thus $\Delta r_2 = 0$ and the beam remains unperturbed for all $\theta_1$ provided:

$$pP_{11} = P_{12} = 0 \quad (13)$$

For chromatic blurring, when the ion energy changes an amount $\delta E$ from a nominal value E the focal lengths change from $f_i$ to $\bar{f}_i$ (i=1,2) where $$f_i = f_i - \delta_i; \, \bar{f}_i' = \delta_i' \quad (14)$$

and $$\delta_i = -\left(\frac{\partial f_i}{\partial E}\right) \delta E; \, \delta_i' = -\left(\frac{\partial f_i'}{\partial E}\right) \delta E \quad (15)$$

In addition the focal planes change their location from $F_i$ to $\bar{F}_i$ and $F_i'$ to $\bar{F}_i'$ respectively corresponding to displacements along the beam axis as shown in FIG. 3 and therefore:

$$d_i = F_i \bar{F}_i; \, d_i' = F_i' \bar{F}_i' \quad (16)$$

The well known Liouvilles theorem applies independently of these changes. To zeroth order of approximation, sufficient for the discussion which follow:

$$\bar{f}_1/\bar{f}_2 = f_1/f_2; \, \bar{f}_1'/\bar{f}_2' = f_1'/f_2' \quad (17)$$

consequently:

$$\delta_2 f_1 = \delta_1 f_2; \, \delta_2' f_1' = \delta_1' f_2' \quad (18)$$

For lens L the transformation from $F_1$ to $F_2$ becomes $$T + \Delta = \begin{bmatrix} 1 & d_2 \\ 0 & 1 \end{bmatrix} \begin{bmatrix} 0 & f_1 - \delta_1 \\ -1/(f_2 - \delta_2) & 0 \end{bmatrix} \begin{bmatrix} 1 & d_1 \\ 0 & 1 \end{bmatrix} \quad (19)$$

from which one can derive, retaining only first order terms in d and $\delta$:

$$\Delta = -\frac{1}{f_2} \begin{bmatrix} d_2 & \delta_1 f_2 \\ \delta_2/f_2 & d_1 \end{bmatrix} \quad (20)$$

Similarly for lens L'

$$\Delta' = -\frac{1}{f_2'} \begin{bmatrix} d_2' & \delta_1' f_2' \\ \delta_2'/f_2' & d_1' \end{bmatrix} \quad (21)$$

Substituting these expressions for $\Delta$ and $\Delta'$ into eq. (11) and using the explicitly derived expression for $P_{11}$ and $R_{12}$ in eq. (13) gives:

$$\frac{\delta_2 f_1}{(d_2' f_2)} = \frac{(gp - f_1 f_2) + p f_1'(\delta_2'/d_2')}{f_1' f_2'(d_1 f_2/\delta_2 f_1 + p/f_1)} \quad (22)$$

In general then, it is possible to select q and p such that eqs. (9) and (22) are simultaneously satisfied implying that chromatic blurring is absent at the image plane and the final beam is telecentric. Without changing the nature of this general result it is possible to simplify eq. (22). For both Einzel lenses and gap lenses operating at a voltage ratio of 10:1 or greater, energy change in the incident ions do not result in a significant change in the location of the principal planes. In other words, the shift in focal planes is mainly a result of the change in focal length, i.e.:

$$d_i \approx \delta_i; \quad d_i' \approx \delta_i' \quad (23)$$

With this approximation and the approximation of equation (18) the results in summary are: For the telecentricity condition:

$$qp = f_1 f_2 \quad (24)$$

For the achromatic condition with telecentricity:

$$\frac{(\delta_1/f_1)}{(\delta_1'/f_1')} \approx \frac{p}{(p + f_1)} \quad (25)$$

In practice a solution can be found for p provided $\delta_1/f_1 < \delta_1'/f_1'$, i.e. the first lens must have a smaller chromatic effect than the second. Note that the choice of p and q to satisfy eqs. (24) and (25) does not in any way affect the image or magnification condition discussed above. Furthermore, the last lens can be simply scaled in size without affecting the conditions expressed by eqs. (24) and (25). This is because $\delta_1'$ is proportional to $f_1$; ' regardless of the lens size. Scaling only the size of the last lens provides a convenient way to change the magnification for the column.

The effects of lens distortion will now be considered. When an ion passes through a round lens, third order aberrations occur. The focal plane to focal plane transfer including these aberrations has the form:

$$r_2 = f_1 \theta_1 = A r_1^3 + A r_1^3 + B r_1^2 \theta_1 + C r_1 \theta_1^2 + D \theta_1^3$$

$$\delta_2 = -r_1/f_2 + a r_1^3 + b r_1^2 \delta_1 + c r_1 \delta_1^2 + d \delta_1^3 \quad (26)$$

Where A, B, C, D and a, b, c, d, are constants for a particular lens geometry and voltage ratio. Applying these expressions to lens L, along with the point source condition $r_1 = p \delta_1$ of eq. (7), leads to the following result for the perturbation matrix $\Delta$:

$$\Delta = \begin{bmatrix} 0 & F(p)\theta_1^2 \\ 0 & G(p)\theta_1^2 \end{bmatrix} \quad (27)$$

where:

$$F(p) = Ap^3 + Bp^2 + Cp + D$$

$$G(p) = ap^3 + bp^2 + cp + d \quad (28)$$

The coordinates of a ray at $F_1'$ of Lens L' are given by $$\begin{bmatrix} r_1' \\ \theta_1 \end{bmatrix} = \begin{bmatrix} 1 & q \\ 0 & 1 \end{bmatrix} \begin{bmatrix} r_2 \\ \theta_2 \end{bmatrix} \quad (29)$$

Ignoring induced aberrations greater than third order eqs. (7), (26) and (29) lead to $$r_1' \approx (f_1 - qp/f_2) \delta_1$$

$$\delta_1' \approx -(p/f_2) \delta_1 \quad (30)$$

Assuming the telecentricity condition is nearly satisfied, $r_1'$ is small and powers greater than $r_1'^2$ will be disregarded. Apply eq. (26) to Lens L' gives $$r_2' \approx f_1 \delta_1' + C(qp/f_2 - f_1)(p/f_2) \delta_1^2 \delta_1' + D(p/f_2)^2 \delta_1^2 \delta_1'$$

$$\delta_2' \approx -r_1'/f_2 + c(qp/f_2 - f_1)(p/f_2) \delta_1^2 \delta_1' + d(p/f_2)^2 \delta_1^2 \delta_1' \quad (30)$$

The perturbation transformation matrix for L' immediately follows:

$$\Delta = \begin{bmatrix} 0 & F'(p)\theta_1^2 \\ 0 & G'(p)\theta_1^2 \end{bmatrix} \quad (32)$$

where $$F'(p) = C'(qp/f_1 - f_1)(p/f_2) + D'(p/f_2)^2$$

$$G'(p) = c'(qp/f_1 - f_1)(p/f_2) + d'(p/f_2)^2 \quad (33)$$

Substituting $\Delta$ and $\Delta'$ above, into eq. (11) gives the total perturbation transform matrix P:

$$P = \begin{bmatrix} -\frac{F(p)}{f_2} \theta_1^2 & f_1'G(p)\theta_1^2 \\ -\frac{G(p)}{f_2} \theta_1^2 & -1/f_2'\{F(p) + qG(p)\}\theta_1^2 \end{bmatrix} \quad (34)$$

Thus the perturbation $\Delta r_2'$ at the image plane resulting from geometrical aberrations is:

$$\Delta r_2' = -[f_1'G(p) - (p/f_2)F(p)]\delta_1^3 \quad (35)$$

The condition for a distortion free image is thus:

$$(f_2/p)G(p) = F(p)/f_1' \quad (36)$$

and for a nearly telecentric situation, eq (33) implies:
$$F(p) = D'(p/f_2)^2 \quad (37)$$

Which gives the distortion free condition with telecentricity:

$$G(p)/(D'/f_1') = (p/f_2)^3 \quad (38)$$

According to eq. (31) D' has the dimensions of length. Hence, as the last lens is scaled in size, $D'/f_1'$ will remain constant and eq. (38) once satisfied is always satisfied regardless of the actual size of the last lens. As mentioned above this is also the situation for the achromatic condition.

Since G(p) is a polynominal in p, a real solution of eq. (38) for p is not apriori assured. However, the choice of lenses and their relative parameters, voltage ratio and size, can be selected to enable acceptable practical values to be found for p and q that simultaneously satisfy the three conditions expressed by eq (24), (25) and (38) and thus assures the effects of lens distortion and chromatic blurring to be minimized in a telecentric beam.

In accordance with these principles, the lens system of the invention, in which the first lens is an accelerating Einzel lens and the second is a gap lens, enables substantial, simultaneous minimization of chromatic blurring and lens distortion and the obtaining of near telecentricity, together with the other important attributes of the lens system that have been described. It is a particular feature that the ion beam of such a system may have a desired, low level of energy at the mask and a much higher energy at the wafer. The accelerating Einzel lens is only slightly more aberrant than the gap lens which it precedes in the design of FIG. 2. In order to satisfy achromaticity $\delta_1/f_1 < \delta_1'/f_1'$ the gap lens may be chosen to operate at a lower voltage ratio than the accelerating Einzel lens. In general, however, $G(p) > D'/f_1'$ and eq (38) is rather easy to satisfy with reasonably large values of p for this configuration.

The condition of perfect telecentricity is not a fundamental lithographic requirement. Accepting a condition where the beam is near telecentric rather than perfectly telecentric allows more scope and flexibility in simultaneously meeting the requirements for achromatic, distortion free transport.

Employing the ion optical scheme described in the preferred embodiment shown in FIG. 2, the system is capable of simultaneously providing the following performance characteristics for the production of quality microchips with submicron features.

1. The formation of an image that is reduced by at least a factor of 1.5:1 or 2:1 compared to the mask and is at least 10 mm squared at the image plane.

2. The image distortions are less than 0.2 microns.

3. The blurring of images due to energy spread of the ions is less than 50 nm.

4. The system is nearly telecentric at the image plane.

5. The initial energy of the ions (at the mask plane) is 1-10 Kev.

6. The final energy of the ions hitting the target is 50-200 Kev.

7. The machine dimensions are consistent with the requirements of typical integrated circuit manufacturing facility due to the shortness of the conjugate length of the lens system.

Metroloqy

During operation linear errors such as x, y translation, errors in $M_x$ or $M_y$ and $\Phi$ are detected by the alignment beamlets, the signals from which are used to apply correcting voltage to the corresponding ion optical elements in real time.

Inevitably, however, imperfections in the physical construction of the machine will lead to nonlinear geometric distortions and chromatic blurring of the image. From time to time, to correct these errors as much as possible, the effect of the various ion optical parameters on such distortions and blurring must be determined empirically so that the system optical elements can be set to effect the corrections.

Figure 10A:
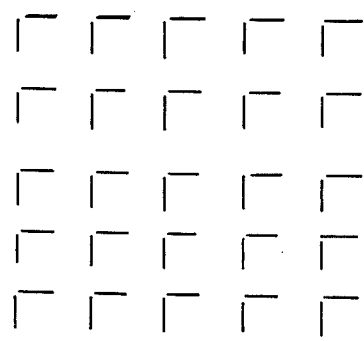
FIG. 10a is a view of the image pattern used for measurements with the system in the metrology mode.
Figure 11A:
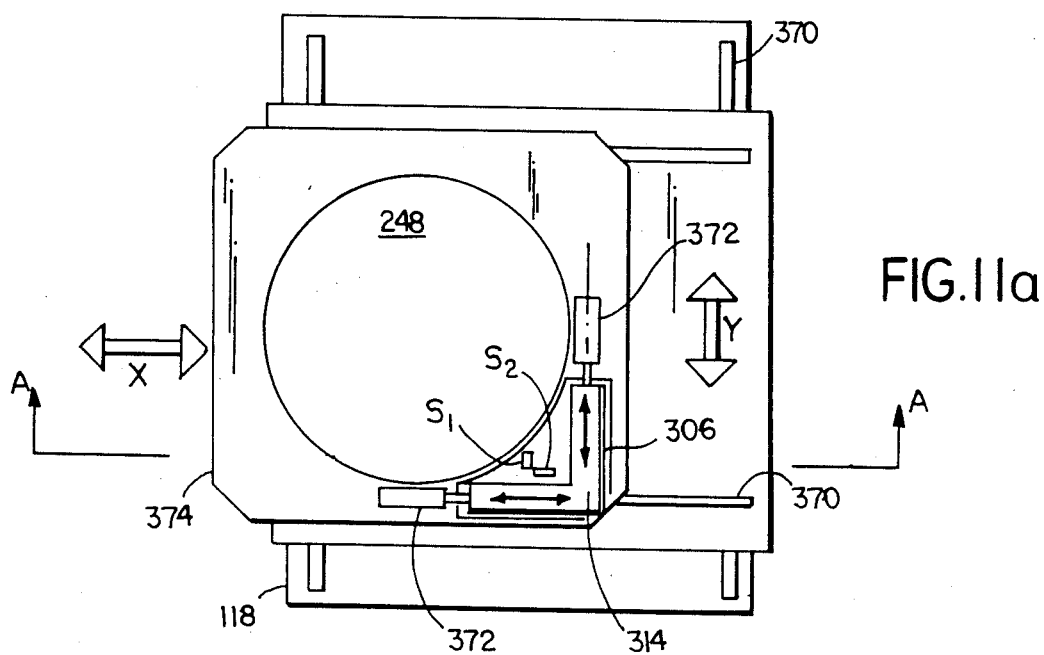
FIG. 11a is a top view of the target area and the metrology stage.

For measuring the errors, the system is configured in a metrology mode by employing a metrology mask having slits for producing a pattern of beamlets, FIG. 10a, and a detector slit arrangement $S_1$, $S_2$ mounted on a precision stage 306, FIGS. 9, 11a. The beamlets produced by the slit arrangement of the metrology mask are intercepted by the slits $S_1$ or $S_2$, on the metrology stage by moving the stage in X direction or in Y direction (together with the detector 304 fixed on the stage). The amount of movement required to intercept successive beamlets, determines the actual position of each beamlet and by comparing this position with the nominal position of the corresponding slit in the mask (taking into account the scale of projection) the geometric distortion error in the respective region of the beam field is determined. Likewise by determining the amount of movement of a slot during which a given beamlet continues to produce a detected signal, the width of that beamlet is determined, which can be compared to the nominal beamlet width to determine the degree of blurring in that region of the beam field. From these error functions the necessary compensation parameters can be derived.

Figure 10B:
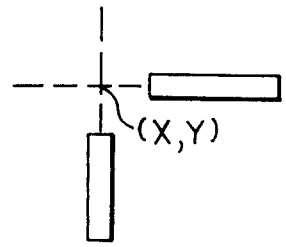

The preferred embodiment employing this system will now be described in greater detail. The pattern produced by the metrology mask comprises $(2n+1)^2$, pairs (where n=integer sufficient to provide the desired resolution) of X and Y ribbon-shaped metrology beamlets in the projection field. For purposes of illustration the pattern in FIG. 10a is for n=2. As can be seen in FIG. 10b, the beamlets of each pair are non-interfering but in close proximity of each other so as to define a unique X, Y field point by the intersection of their longitudinal projections. These beamlets, created in the die field by the special metrology mask and projected through the column, are reduced by the optical system. In the case of demagnification by a factor of 4, originally the mask openings would be spaced across an approximately 40 mm×40 mm field and on the wafer, with the 4 to 1 reduction, over a 10 mm×10 mm field.

The centroid position and width, respectively, of each ribbon-beamlet is measured with an absolute accuracy of 0.01 microns using a small detector 304 which may be for example, a channeltron collecting secondary electrons carried on the metrology stage 306, FIGS. 9, 11a, which is in turn mounted on the X, Y, stage 118, FIG. 9. The beamlet enters a slit 330 ($S_1$ or $S_2$ in FIGS. 9b and 11a) on the stage and impinges upon a metal surface 308. Secondary electrons 310 ejected from the surface 308 are detected by the channeltron 304.

Figure 9A:
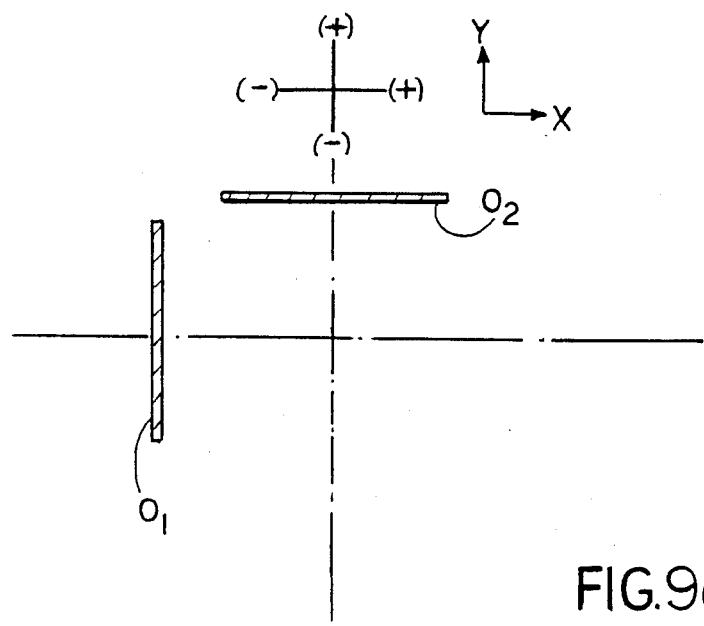
FIG. 9a is a view of the openings in the metrology mask for forming the beamlets used in the metrology mode.
Figure 9B:
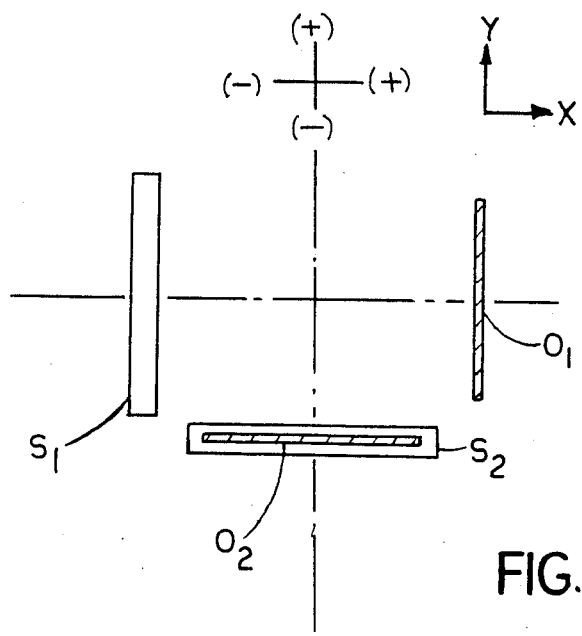
FIG. 9b is a view of the slits in the metrology stage for measurement of the beamlets formed by the metrology mask.

Referring now to FIGS. 9a and 9b, two perpendicular slits in the metrology mask (FIG. 9a) form a pair of orthogonal beamlets $O_1$ and $O_2$. On the metrology stage (referring now to FIG. 9b) two orthogonal detection slits $S_1$, $S_2$ above the stage-mounted detector for receiving the imaged, inverted beamlets are provided. The detection slits are arranged as shown such that only one of the imaged orthogonal beamlets may pass through its respective slit on the stage at one time. In the present example, beamlet $O_1$ is centered perpendicular to the negative X axis and beamlet $O_2$ is centered, perpendicular to the positive Y axis before imaging as shown in FIG. 9a. After imaging each beamlet inverts, $O_2$ centered perpendicular to the negative Y axis and $O_1$ centered perpendicular to the positive X axis. Detection slit $S_2$ is positioned coincident with inverted beamlet $O_2$ and may be detected. Detection slit $S_1$, is positioned away from impinging beam $O_1$ when $O_2$ is being measured. This arrangement assures signal measured by the detector will only arise from $O_2$. Likewise, the stage 306 may be moved to detect $O_1$ without interference from $O_2$.

The effects on the image quality, blurring and distortion, of the various adjustable parameters in the ion projection machine can be delineated in a quantitative way using the metrology system described above. In turn this enables the parameters to be set at prescribed values to optimize the image quality and to substantially compensate for imperfections inevitably present in the physical construction of the machine and certain types of non-linear errors that may be present in patterned production masks.

A typical set of n adjustable parameters for the machine is:

1. X position of the source relative to the axis of the first lens.
2. Y position of the source relative to the axis of the first lens.
3. X position of the solenoid relative to the axis of the first lens.
4. Y position of the solenoid relative to the axis of the first lens.
5. X position of the second lens relative to the axis of the first lens.
6. Y position of the second lens relative to the axis of the first lens.
7. X position of the mask relative to the axis of the first lens.
8. Y position of the mask relative to the axis of the first lens.
9. Electric current passing through solenoid.
10. Voltages on individual electrodes of each of the multipoles.
11. Fine adjustments on voltages of the two main lenses.
12. Electric currents passing through current elements of magnetic shield.
13. Axial position of image.
14. Spacing between the first and second lenses.
15. Extraction voltage from the ion source.
16. Selected parameter (or parameters) of the ion source that affects the ion beam energy spread (e.g. magnetic field at ion source, filament heater power or gas pressure).

To calculate the optimum setting for the adjustable parameters it is first necessary to measure their respective gradient or "shim" functions as now described. The n parameters are set at a nominal initial value $P_1$ (j=1,2, ... n). Using the metrology mask and stage mounted detector and orthogonal slits as previously described, the errors $Q_1$ (X,Y) are measured at each field point (X,Y) defined by the orthogonal pairs of beamlets (shown in FIG. 10b) projected from the mask to the image plane. The index i refers to the type of error: e.g.

$Q_1$ (X,Y)=X deviation from the position X.
$Q_2$ (X,Y)=Y deviation from the position Y.
$Q_3$ (X,Y)=X blurring of image beamlet.
$Q_4$ (X,Y)=y blurring of image beamlet.

One of the parameters $P_1$ is then changed in value by an amount $\Delta P_j$ and the changed set of error functions $Q_{ji}$ (X,Y) is measured with the metrology system. The shim function is simply the difference between the error $Q_i$, before and $Q_{ji}$, after adjustment of the parameter $P_j$ divided by the magnitude of that adjustment $\Delta P_j$; namely, $$S_{ji}(X,Y) = [Q_{ji}(X,Y) - Q_1(X,Y)]/\Delta P_j$$

The parameter j is returned to its initial value $P_j$ and the measurement process repeated until the shim functions, $S_{ji}$ are determined for all parameters j=1,2, ... n.

To the extent that the perturbations on the error functions are linearly dependent on the shift $\Delta P_j$ in the value of $P_j$ of any of the adjustable parameters, normally the case for small adjustments, the resulting error function from a general set of shifts is given by $$Q_i'(X,Y) = Q_i(X,Y) + \Sigma_j \Delta P_j' S_{ji}(X,Y)$$

Using well known techniques in numerical analysis (e.g. Practical Optimization Techniques; P. E. Gill, W. Murray, M. H. Wright, Academic Press, 111 5th Avenue, NY, N.Y. 10033, 1981) an optimum set of adjustments $\Delta P_j'$ can be determined by the computer system of the machine which minimizes some function of the error function Q' (X,Y). For example a typical optimization might be to set limits $L_i$ on each type of error i and to optimize such that the difference between the maximum error QMAX; observed over the entire image field and the limit $L_1$ is a minimum, i.e.

$$|QMAX_i - L_1| \text{ is minimized}$$

where
$$QMAX_i = MAX[|Q_i'(X,Y)|] (\text{for all } X, Y)$$

Furthermore, the optimization can be subject to practical constraints on either the parameter values $P_j$ and/or the errors $Q_i$. A typical useful constraint is to limit the range of each parameter value:

$$|P_j'| \leq PMAX_j$$

where
$$P_j' = P_j + \Delta P_j'$$

and PMAX$_j$ is the maximum allowed value for P$_j$. If it is desired to simultaneously correct for known mask errors, QMASK$_i$(X,Y) then |QMAX$_i$−L| would be minimized where now $$QMAX_i = MAX[Q_i'(X,Y) + QMASK_i(X,Y)]$$

The great utility of the metrology system and optimization procedure arises because the shim functions S$_{ji}$(X,Y) are generally quite stable with time and need only be measured occasionally. On the other hand, when variations occur in the physical environment of the ion projection machine, e.g., temperature or barometric pressure changes, the particular combination of shim functions (and hence parameter values P$_j$) to obtain optimum performance will in general also change. Using a suitable computer program, required changes are calculated rapidly by the above described techniques once the metrology system has measured the nominal existing errors Q$_i$(x,y).

Figure 11B:
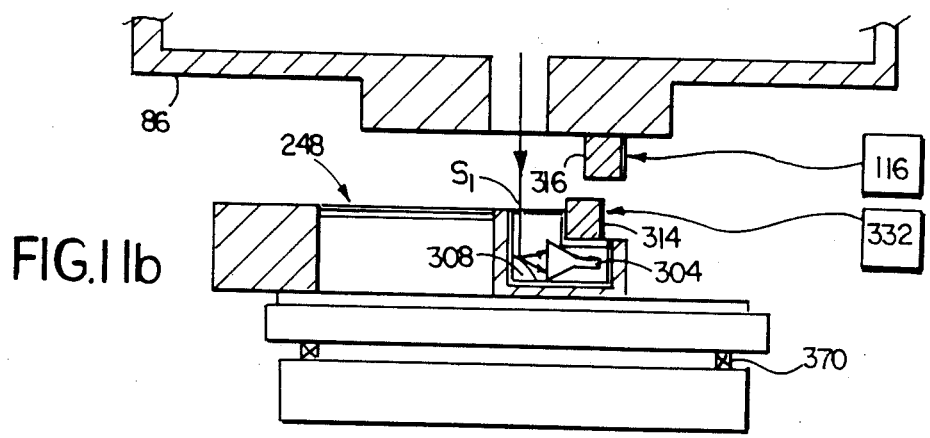

In a preferred embodiment the metrology detector system is permanently mounted on the stage 40 shown in FIG. 2 or stage 118 as shown in FIGS. 11a and 11b. It can then be used at any time to rapidly measure the existing errors Q$_i$(x,y) after which the adjustable parameters can be optimized.

Since the metrology measurements need only be made over the size of the image field, typically no greater than 20 mm×20 mm, the X, Y position of the slits S$_1$ and S$_2$ can be measured using a laser interferometer 332 and a relatively small orthogonal mirror 314. The X, Y positions of the metrology slits S$_1$ and S$_2$ are referred to the column via the laser mirror 316 and rigidly attached interferometer 116 and 332. It is also possible to ensure the beam is maintained in a stable condition at the end of the column by using a reference ring 300 as shown in FIG. 9 and the previously described scanning and detection system. The ring is rigidly attached to the end of the column and bears alignment marks 302. The scanning and deflection system detects the position of these marks and maintains the position of the exposure beam in reference to them.

In an arrangement where the alignment system previously described is used, the coarse X, Y stage 118 shown in FIGS. 11a and 11b does not require laser interferometry position control for producing images over a wafer 248. The position accuracy needed for the metrology detector slits can be realized by mounting the slits and S$_1$ and S$_2$ and mirror 314 on a separate limited range stage 306.

Referring to FIG. 11a and 11b, the metrology stage 306 is mounted on the coarse X, Y stage 118, and can be moved within plus or minus 5 microns of the beamlets' positions very quickly. The metrology stage itself, carrying the detector cage, is provided with transducers, such as piezoelectric transducers 372, that can move the detector, for example, plus or minus 15 microns in the X and Y direction. Once the X, Y, stage has moved the metrology stage to the approximate position of one of the projected beamlets, the metrology stage is moved to find the exact center and width of the beamlet.

The coarse X, Y stage 118 is mounted on ways 370 that enable use of a large block 374, for example, about nine inches square, into which wafers 248 can be inserted, for example, from the back side. The motion required to expose the wafers is achieved, for example, with dc motors under the control of, for example, glass rules or 2-axis laser interferometry. The stage can be stepped to any position within this 9 inch×9 inch field with good accuracy to within plus or minus 5 microns. If mirrors are attached to the stage then in combination with a laser interferometer positions can be set to within a fraction of a micron.

The usefulness of the metrology system relies on the accuracy of the X, Y positioning of the detector slits and, therefore, on the accuracy of the stage 306. In the arrangement shown in FIGS. 11a and 11b, the stage can be calibrated for precision and accuracy by imposing a metrology reference marker on wafer 248 at different X, Y values determined by the laser interferometry system. The position of these markers on the wafer can be independently verified using an off-line metrology tool, such as a Nikon 2I optical system or an electron beam tool.

Several modifications and variations of the present invention are possible when considered in the light of the above teachings. It is therefore understood that the scope of the present invention is not to be limited to the details disclosed herein, but may be practiced otherwise than as specifically described, and is intended only to be limited by the claims appended hereto:

We claim:

1. An ion projection lithography apparatus comprising:
    means to provide an ion beam,
    a mask in the path of said ion beam with apertures for producing a desired beam pattern,
    an optical column after said mask,
    said column defined by first and second principal lenses located along said ion path,
    said first lens being an accelerating Einzel lens arranged to form a crossover within said column,
    said second lens positioned after said crossover and being a gap lens, arranged to project a reduced image of said mask and
    a target station after said gap lens for supporting a target that receives said image.

2. The apparatus of claim 1 wherein said mask is located substantially at the first focal plane of said first lens and said target station is located substantially at the second focal plane of said second lens.

3. The apparatus of claim 2 wherein said means to provide said ion beam comprises an ion source and means to provide to said lens column a virtual image of said ion source more distant from said column than said ion source and the distances (1) between the second focal plane of said first lens and the first focal plane of said second lens, and (2) between said mask and a point defining the virtual image of said source and said mask, being selected to produce said image of said mask at said target with chromatic blurring and geometric distortion arising from said lenses simultaneously substantially minimized.

4. The apparatus of claim 3 in which said lenses are Positioned to locate said crossover of said first lens substantially at the first focal plane of said second lens to produce a substantially telecentric beam following said second lens.

5. The apparatus of claim 1 wherein said lens system simultaneously satisfies substantially the following conditions whereby the beam emerging from the second lens is substantially telecentric and when it reaches the image plane is substantially free of chromatic blurring and geometric distortion:

$$qp = f_1 f_2 \tag{1}$$

$$\frac{(\delta_1/f_1)}{(\delta_1'/f_1')} \simeq \frac{p}{p+f} \qquad (2)$$

$$\frac{G(p)}{(D'/f_1')} \simeq \left(\frac{p}{f_2}\right)^3 \qquad (3)$$

where q is the distance between the second focal plane of the first lens and the first focal plane of the second lens, p is the distance between a point defining the virtual image of said source and said mask, $f_1$ is the first focal length of said first lens, $f_1'$ is the first focal length of said second lens, $f_2$ is the second focal length of said first lens, $\delta_1$ and $\delta_1'$ are the changes in the first focal length of said first and said second lenses, respectively, due to a change in the energy of said ions in said beam, $$G(p) = ap^3 + bp^2 + cp + d$$

where a, b, c and d are lens constants related to the transfer function from the first focal plane to the second focal plane of the first lens, in the presence of third order aberrations, said transfer function being of the form:

$$\delta_2 = -r_1/f_2 + ar_1^3 + br_1^2\delta_1 + cr_1\delta_1^2 + d\delta_1^3$$

where $\delta_2$ is the transformed transverse angular coordinate of a given ion ray at the second focal plane of said first lens, $r_1$, $\delta_1$ are said transverse coordinates at the first focal plane of said first lens at said mask and D' is a coefficient in the transformation from the first focal plane to the second focal plane of the second said lens:

$$r_2' \simeq f_1'\delta_2 + D'\delta_2^3$$

where $r_2'$ is the radial coordinate of the ray at the second focal plane of the second lens.

6. The apparatus of any of the claims 1-5 adapted to provide ions in said ion beam at said target at energy between about 50 and 200 kV.

7. The apparatus of claim 6 adapted to provide ions in said ion beam at the mask at energy between about 1 and 10 kV.

8. The apparatus of any of the claims 1-5 wherein said image of said mask at said target is reduced by a factor of 1.5 or more, said image at said target being no less than 10 mm in width and height.

9. The apparatus of any of claims 1-5 further comprising a pair of field control apertures, one disposed on each side of the second electrode of said Einzel lens for reducing the electric field strength arising from said second electrode in the area about said mask and the area about the aperture of the third electrode of said Einzel lens.

10. The apparatus of any one of claims 1-5 adapted to apply a voltage ratio in the range of 7-20 to said first and second lenses.

11. The apparatus of any of claims 1-5 wherein said means to provide said ion beam comprises an ion source and a lens located between said ion source and said mask for selecting the virtual source point along the axis of said optical column to fine-tune said system for simultaneously minimizing chromatic blurring and lens distortion.

12. The apparatus of claim 11 wherein said lens is a solenoid, said solenoid adapted to contribute to the selection of the desired ion specie from various species of different mass issued from said source by differential deflection of said species according to their mass.

13. The apparatus of claim 12 further comprising an aperture located between said first and second lenses to Prevent passage of ions differing in mass from the desired specie.

14. The apparatus of any one of claims 1-5 further comprising a multipole means located within said second lens or beyond for application of quadrupole fields to vary the magnification of the image at said target in the X direction relative to the magnification of the image in the Y direction.

15. The apparatus of claim 14 wherein said multipole means is located after said second lens in a region substantially free of electrical fields.

16. The apparatus of any of claims 1-5 further comprising a multipole means located between said first and second lenses adapted to apply dipole fields for adjustable movement of said image in the plane perpendicular to the axis of said optical column.

17. The apparatus of claim 16 wherein said multipole means is further adapted to produce superposed higher order fields for control of distortion and blurring in said image.

18. The apparatus of claim 16 wherein said multipole means is a pair of successive sixteen pole circular arrays of arc-form electrodes adapted to introduce a parallel offset to said beam.

19. The apparatus of any of claims 1-5 further comprising a voltage adjustment device for variation of the lens voltages for fine-tuning the balance of distortion and blurring in said image.

20. The apparatus of claim 19 wherein said voltage adjustment device is further capable of disproportionate adjustment of said lens voltages for tuning said magnification of said image at said target.

21. The apparatus of any of the claims 1-5 in which the voltage on the first electrode of the gap lens is substantially the same as the voltage on the first and third electrodes of the Einzel lens and the voltage on the second electrode of the gap lens is substantially the same as the voltage on the second electrode of the Einzel lens whereby ripple effects on the power supply do not substantially alter the voltage ratio of the lens column thus substantially preserving the quality of the image at said target station.

22. The apparatus of any of the claims 1-5 constructed to enable the diameter of said gap lens to be changed to vary the magnification of said image at said target, said beam emerging from said second lens, upon said change, remaining substantially telecentric and substantially free of chromatic aberration and geometric distortion at the image plane.

23. The apparatus of any of the claims 1-5 wherein said lens column includes an external, rigid metal shell which extends substantially the full length of said lens column, said shell being at constant potential and directly supporting the first and third electrode of said Einzel lens and the first electrode of said gap lens, the middle electrode of said Einzel lens being supported by insulators engaged for support upon the interior of the metal shell and the second electrode of said gap lens supported via an insulator bushing supported by the downstream end of said rigid shell.

24. The apparatus of claim 23 wherien a tubular shield of high permeability magnetic material extends about and is supported by said rigid metal shell.

25. The apparatus of claim 24 wherein said tubular shield is comprised of a series of removable longitudinal segments.

26. The apparatus of claim 24 wherein end plates of high permeability magnetic material are mounted at each end of said tubular shield in a manner to provide magnetic continuity with said tubular shield.

27. The apparatus of claim 24 wherein an array of longitudinally extending electrically conductive loops is associated with said shield, said loops being arranged to establish magnetic flux in the circumferential direction in said tubular shield.

28. The apparatus of claim 27 including means to apply an alternating electrical current to the loops to demagnetize the shield and means to apply a momentary small bias current to the loops to increase the magnetic permeability of the shield.

29. The apparatus of claim 27 wherein each of said conductive loops comprises longitudinally extendign conductive segments extending along the interior and the exterior of said tubular shield.

30. The apparatus of claims 27 including electrical conductors inside the shield arranged to provide adjustment to the magnetic field to which the ion beam is exposed.

31. An ion projection lithography apparatus comprising:
    means to provide an ion beam,
    a mask in the path of said ion beam with apertures for producing a desired beam pattern,
    an optical column after said mask,
    said column defined by first and second principal lenses located along said ion path,
    said first lens being arranged to focus said ion beam,
    said second lens positioned after said first lens and being arranged to project a reduced image of said mask,
    a target station after said second lens for supporting a target that receives said image, and a shield of high permeability magnetic material extending about said optical column, said shield being comprised of a series of removable longitudinal segments that define a tubular shield and end plates of high permeability magnetic material in magnetic continuity with said tubular enclosure, said segment being defined by a set of longitudinally extending circumferentially spaced ribs mounted about said optical column, and a set of removable longitudinally extending side plates, each said plate spanning the gap between and in magnetic continuity with adjacent ribs, and electrical conductors positioned inside the shield and arranged to provide adjustment enabling reduction of a stray magnetic field in the region of the ion beam.

32. The apparatus of cliam 31 wherien said electrical conductors comprise an array of elongated loops within said shield.

33. The apparatus of claim 31 wherein an array of longitudinally extending electrically conductive loops is associated with said shield, said loops being arranged to establish magnetic flux in the circumferential direction in said tubular sheidl.

34. The apparatus of claim 33 including means to apply an alternating electrical current to the loops to demagnetize the shield and means to apply a momentary small bias current to the loops to increase the magnetic permeability of the shield.

35. The apparatus of claim 33 wherein each of said conductive loops comprises longitudinally extending conductive segments extending along the interior and the exterior of said tubular shield.

36. The apparatus of claims 33 including electrical conductors inside the shield arranged to provide adjustment to the magnetic field to which the ion beam is exposed.

37. An ion projection lithography apparatus comprising:
    means to provide an ion beam,
    a mask in the path of said ion beam with apertures for producing a desired beam pattern,
    an optical column after said mask,
    said column defined by first and second principal lenses located along said ion path,
    said first lens being arranged to focus said ion beam,
    said second lens positioned after said first lens and being arranged to project a reduced image of said mask and
    a target station after said second lens for supporting a target that receives said image,
    said means to provide said ion beam comprises an ion source and a solenoid lens located between said ion source and said mask for selecting the virtual source point along the axis of said optical column,
    said solenoid adapted to contribute to the selection of the desired ion specie from various species of different mass issued from said source by differential deflection of said species according to their mass.

38. The apparatus of claim 37 wherein said solenoid is a counterwound double solenoid adapted to prevent rotation of said ion beam during passage through said solenoid.

39. The apparatus of claim 37 or 38 further comprising an aperture located between said first and second lenses sized to prevent passage of ions differing in mass from the desired specie.

40. An ion projection lithography apparatus comprising:
    means to provide an ion beam,
    a mask in the path of said ion beam with apertures for producing a desired beam pattern,
    an optical column after said mask,
    said column defined by first and second principal lenses located along said ion path,
    said first lens arranged to focus said ion beam,
    said second lens positioned after said first lens and being arranged to project a reduced image of said mask,
    a target station after said second lens for supporting a target that receives said image, and
    a multipole means located within said second lens or beyond and a voltage control system adapted to apply quadrupole fields to said multipole means to vary the magnification of the image at said target in the X direction relative to the magnification of the image in the Y direction.

41. The apparatus of claim 40 wherein said multipole means is located after said second lens in a region substantially free of electrical fields.

42. The apparatus of claim 40 wherein said multipole means is a sixteen pole circular array of arc-form electrodes.

43. A lithographic method of producing features of size of the order of 0.1 micron on a target comprising,
providing an ion beam projection lithographic apparatus capable of imaging the desired features of a lithographic mask upon a target field, the system having a set of adjustable parameters,
using a metrology mask having an array of metrology features, empirically determining the effect of each of said parameters across the target field while the other parameters are held constant to provide a set of shim functions,
initially setting the parameters of said system by linear optimization based upon metrology measurements across said field, exposing targets through a lithographic mask having desired features, periodically interrupting said exposure, substituting for said lithographic mask a metrology mask defining an array of metrology features across said field,
determining from said measurement a set of error values, and by linear optimization, determining adjustments to said set of parameters to reduce said error values on the basis of said shim functions, making said adjustments, and resuming said exposure of targets.

44. The lithographic method of claim 43 wherein said metrology mask defines an array of pairs of orthogonal slits for producing corresponding pairs of metrology ion beamlets that proceed to said target and said step of empirically determining the effect of each of said parameters across the target field while the other parameters are held constant comprises measuring the width and determining the centroid position of said beamlets at said target.

45. The method of claim 44 wherein said detector is associated with a pair of orthogonal slits arranged to intercept said metrology beamlets in the manner that only one beamlet of an orthogonal pair falls upon a corresponding slit at one time.

46. An ion beam projection lithography system having a set of adjustable parameters, said system adapted to project an image of a lithography mask upon a target mounted on an X, Y stage, said X, Y stage adapted to index across a number of exposure positions,
a metrology mask adapted to be substituted for said lithography mask, a precision metrology stage mounted on said X, Y stage,
a detector mounted on said metrology stage adapted to be indexed across the ion beam field while said metrology mask is in position to determine error values based upon detected blurring and geometric distortion at points distributed across said field,
said error values being useful to generate, by linear optimization techniques, correction to said set of parameters to reduce blurring and geometric distortion of said system.

47. The lithographic apparatus of claim 46 wherein said metrology mask defines an array of pairs of orthogonal slits for producing corresponding pairs of metrology ion beamlets that proceed to said target and said detector mounted on said precision metrology stage is adapted to measure the width and determine the centroid position of said beamlets at said detector.

48. The apparatus of claim 46 wherein said detector is associated with a pair of orthogonal slits arranged to intercept said metrology beamlets in the manner that only one beamlet of an orthogronal pair falls upon a corresponding slit at one time.

49. An ion projection lithography apparatus comprising:
means to provide an ion beam,
a mask in the path of said ion beam with apertures for producing a desired beam pattern,
an optical column after said mask,
said column defined by first and second principal lenses located along said ion path,
said first lens being an accelerating Einzel lens arranged to form a crossover within said column,
said second lens positioned after said crossover and being a gap lens, arranged to project a reduced image of said mask,
a target station after said gap lens for supporting a target that receives said image, and
wherein said mask has, in addition to mask structure to define the desired image beam, also a set of reference marks that define reference beams adapted to be imaged by the lens column and probe corresponding reference marks at the target station for generating alignment control signals that are connected to bring the image beam into alignment with the desired position on the wafer, wherein deflection means shielded from said image beam are provided to repeatedly scan said reference beam across respective reference marks at the target station.

50. The ion projection lithography system of claim 49 wherein a separate deflection means is associated with each reference beam.

51. The system of claim 50 wherein said deflection means comprise electrostatic deflectors and wherein said image beam passes through a hollow shield while the reference beams pass outside said shield, the shield protecting the image beam from the electric fields of the deflectors.

* * * * *

UNITED STATES PATENT AND TRADEMARK OFFICE
CERTIFICATE OF CORRECTION

PATENT NO. : 4,985,634
DATED : Jan. 15, 1991
INVENTOR(S) : Gerhard Stengl and Hilton F. Glavish It is certified that error appears in the above-identified patent and that said Letters Patent is hereby corrected as shown below:

ON TITLE PAGE:

Assignee(s) should be listed as follows:

(1) Oesterreichische Investitionskredit Aktiengesellschaft
        Vienna, AUSTRIA (2) IMS Ionen Mikrofabrikations Systeme Gesellschaft m.b.H.
        Vienna, AUSTRIA Foreign Priority Applications should be listed as follows:

Europe  No. 88-890133.7  filed 06/01/88
    Austria No. A118/88     filed 01/22/88.

Inventor: Hilton F. Glavish Home Address should be:
--Incline Village, Nevada 89450--

Col. 1, line 21, "Pattern" should be --pattern--

Col. 2, line 23, "$\simeq \frac{p}{p+f}$" should be -- $\simeq \frac{p}{p+f_1}$ -- line 35, "$\delta_2'$" should be --$\delta_1'$--;

line 55, "$r'_2 \simeq f_i \delta_2 + D'\delta_2^3$" should be -- $r'_2 \simeq f_i \theta_2 + D'\theta_2^3$ --

UNITED STATES PATENT AND TRADEMARK OFFICE
CERTIFICATE OF CORRECTION

PATENT NO. : 4,985,634

DATED : Jan. 15 1991

INVENTOR(S) : Gerhard Stengl and Hilton F. Glavish

It is certified that error appears in the above-identified patent and that said Letters Patent is hereby corrected as shown below:

Col. 10, line 40, "Pervade" should be --pervade--.

Col. 13, line 27, insert --.-- after "potential".

Col. 19, line 40-45, "$\Gamma$ = TQT =" should be --$\Gamma$ = T'QT = -- line 67, "$\Gamma_1$" should be --$\theta_1$.--.

Col. 20, line 24, "TQT + $\Delta$'Q$\Delta$ + TQ$\Delta$ + $\Delta$'QT" should be --T'QT + $\Delta$'Q$\Delta$ + T'Q$\Delta$ + $\Delta$'QT --;

line 28, "$\simeq$ TQ$\Delta$'$\Delta$'QT" should be -- = T'Q$\Delta$ + $\Delta$'QT --;

line 38, "$\Delta r_2$ = 0" should be -- $\Delta r_2'$ = 0 --;

line 46, "$f_i = f_i - \delta_i$; $f_i'= \delta_i'$" should be -- $f_i = f_i - \delta_i'$; $f_i' = f_i' - \delta_i'$ --.

Col. 21, line 27, "$R_{12}$" should be --$P_{12}$--;

UNITED STATES PATENT AND TRADEMARK OFFICE
CERTIFICATE OF CORRECTION

PATENT NO. : 4,985,634
DATED : Jan. 15, 1991
INVENTOR(S) : Gerhard Stengl and Hilton F. Glavish It is certified that error appears in the above-identified patent and that said Letters Patent is hereby corrected as shown below:

Col. 22, line 7, "+ $D\delta_1^3$" should be -- + $D\theta_1^3$ --;

line 9, "$\delta_2 = \ldots br_1^2 \delta_1 + cr_1\delta_1^2 + d\delta_1^3$" should be -- $\theta_2 = \ldots br_1^2\theta_1 + cr_1\theta_1^2 + d\theta_1^3$ -- line 13, "$r_1 = p\delta_1$" should be -- $r_1 = p\theta_1$ --;

line 39, "$r_1' \ldots \delta_1$" should be -- $r_1' \ldots \theta_1$ -- line 41, "$\delta_1' \ldots \delta_1$" should be -- $\theta_1' \ldots \theta_1$ --;

line 47, change all occurrences of "$\delta$" to --$\theta$--;

line 49, change all occurrences of "$\delta$" to --$\theta$--;

line 63, "F(p) $\ldots$ /$f_1 - f_1$)" should be --F(p) $\ldots$ /$f_2 - f_1$) --;

line 65, "G'(p) $\ldots$ /$f_1 - f_1$)" should be --G'(p) $\ldots$ /$f_2 - f_1$) --;

Col. 23, line 11, "$\ldots \delta_1^3$" should be --$\ldots \theta_1^3$ --.

Col. 24, line 17, "metroloqy" should be --Metrology--.

UNITED STATES PATENT AND TRADEMARK OFFICE
CERTIFICATE OF CORRECTION

PATENT NO. : 4,985,634
DATED : Jan. 15, 1991
INVENTOR(S) : Gerhard Stengl and Hilton F. Glavish It is certified that error appears in the above-identified patent and that said Letters Patent is hereby corrected as shown below:

Col. 26, line 11, "$P_1$" should be --$P_j$-- line 21, "y" should be --Y--;

line 22, "$P_1$" should be --$P_j$--.

Col. 28, line 57, "Positioned" should be --positioned--

Col. 29, line 4, "$\simeq \frac{p}{p+f}$" should be -- $\simeq \frac{p}{p+f_1}$ line 30, change all occurrences of "$\delta$" to --$\theta$--;

line 32, "$\delta_2$," should be --$\theta_2$--;

line 34, "$r_1, \delta_1$" should be --$r_1, \theta_1$--;

Col. 29, line 40, change all occurrences of "$\delta$" to --$\theta$--.

Col. 30, line 10, "Prevent" should be --prevent--.

Col. 31, line 24, "extendign" should be --extending--;

line 61, "cliam" should be --claim--;

UNITED STATES PATENT AND TRADEMARK OFFICE
CERTIFICATE OF CORRECTION

PATENT NO. : 4,985,634

DATED : Jan. 15, 1991

INVENTOR(S) : Gerhard Stengl and Hilton F. Glavish

It is certified that error appears in the above-identified patent and that said Letters Patent is hereby corrected as shown below:

Column 31, line 68, "sheidl" should be --shield--.

Signed and Sealed this

Eleventh Day of February, 1992

Attest:

HARRY F. MANBECK, JR.

*Attesting Officer*          *Commissioner of Patents and Trademarks*